United States Patent
Ogino et al.

(10) Patent No.: US 9,525,000 B2
(45) Date of Patent: *Dec. 20, 2016

(54) SOLID-STATE IMAGING DEVICE, SOLID-STATE IMAGING DEVICE MANUFACTURING METHOD, ELECTRONIC DEVICE, AND LENS ARRAY

(71) Applicant: Sony Corporation, Tokyo (JP)

(72) Inventors: Akiko Ogino, Kumamoto (JP); Yoichi Otsuka, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/926,923

(22) Filed: Oct. 29, 2015

(65) Prior Publication Data

US 2016/0049433 A1 Feb. 18, 2016

Related U.S. Application Data

(60) Continuation of application No. 14/166,310, filed on Jan. 28, 2014, now Pat. No. 9,202,836, which is a
(Continued)

(30) Foreign Application Priority Data

Sep. 29, 2009 (JP) ................................ 2009-225159

(51) Int. Cl.
*H01L 27/00* (2006.01)
*H01J 3/14* (2006.01)
(Continued)

(52) U.S. Cl.
CPC ....... *H01L 27/14627* (2013.01); *G02B 3/0056* (2013.01); *H01L 27/146* (2013.01);
(Continued)

(58) Field of Classification Search
USPC .............. 250/208.1, 216, 226, 214 R, 214.1;
257/294, 431, 432, 443, 444, 290, 291,
257/292; 348/272, 278–282, 294, 335;
438/57, 438/65
See application file for complete search history.

(56) References Cited

U.S. PATENT DOCUMENTS 7,227,193 B2 * 6/2007 Oda .................. H01L 27/14627
257/431
2007/0153107 A1 * 7/2007 Boettiger ......... B29D 11/00278
348/273

(Continued)

*Primary Examiner* — Pascal M Bui Pho
(74) *Attorney, Agent, or Firm* — Chip Law Group

(57) ABSTRACT

A solid-state imaging device includes: multiple micro lenses, which are disposed in each of a first direction and a second direction orthogonal to the first direction, focus the incident light into the light-receiving surface; with the multiple micro lenses of which the planar shape is a shape including a portion divided by a side extending in the first direction and a side extending in the second direction being disposed arrayed mutually adjacent to each of the first direction and the second direction; and with the multiple micro lenses being formed so that the depth of a groove between micro lenses arrayed in a third direction is deeper than the depth of a groove between micro lenses arrayed in the first direction, and also the curvature of the lens surface in the third direction is higher than the curvature of the lens surface in the first direction.

7 Claims, 25 Drawing Sheets

Related U.S. Application Data division of application No. 12/886,952, filed on Sep. 21, 2010, now Pat. No. 8,686,337.

(51) Int. Cl.
*H01L 27/146* (2006.01)
*H04N 1/195* (2006.01)
*H01L 27/148* (2006.01)
*G02B 3/00* (2006.01)

(52) U.S. Cl.
CPC ........ *H01L 27/148* (2013.01); *H01L 27/1464* (2013.01); *H01L 27/14609* (2013.01); *H01L 27/14612* (2013.01); *H01L 27/14625* (2013.01); *H01L 27/14643* (2013.01); *H04N 1/195* (2013.01); *H04N 1/19526* (2013.01)

(56) References Cited

U.S. PATENT DOCUMENTS

| | | | | |
|---|---|---|---|---|
| 2007/0181923 | A1* | 8/2007 | Tanaka | H01L 27/14627 257/294 |
| 2008/0296643 | A1* | 12/2008 | Inoue | H01L 27/14603 257/292 |
| 2009/0184349 | A1* | 7/2009 | Dungan | H01L 27/14634 257/292 |
| 2009/0261440 | A1* | 10/2009 | Kawasaki | G02B 3/0018 257/432 |

\* cited by examiner

FIG. 4
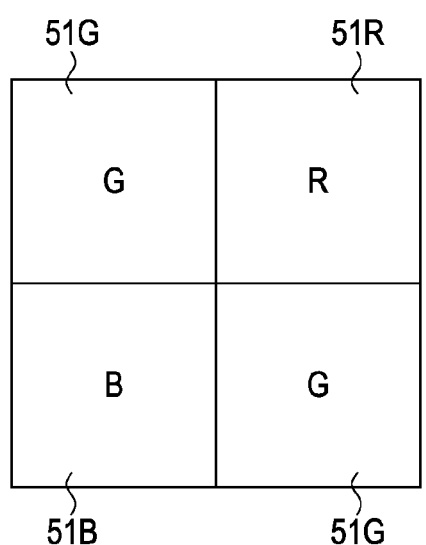
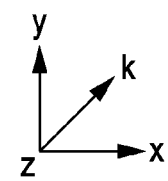

FIG. 9
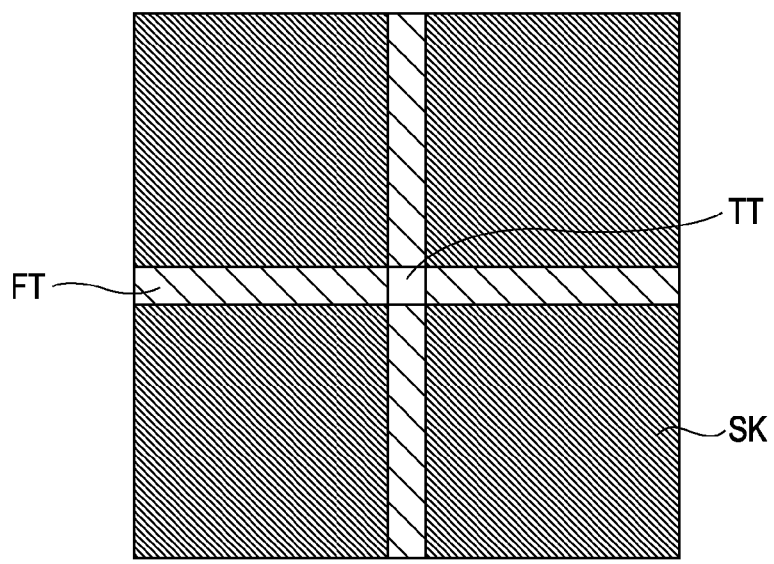
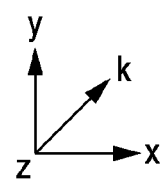

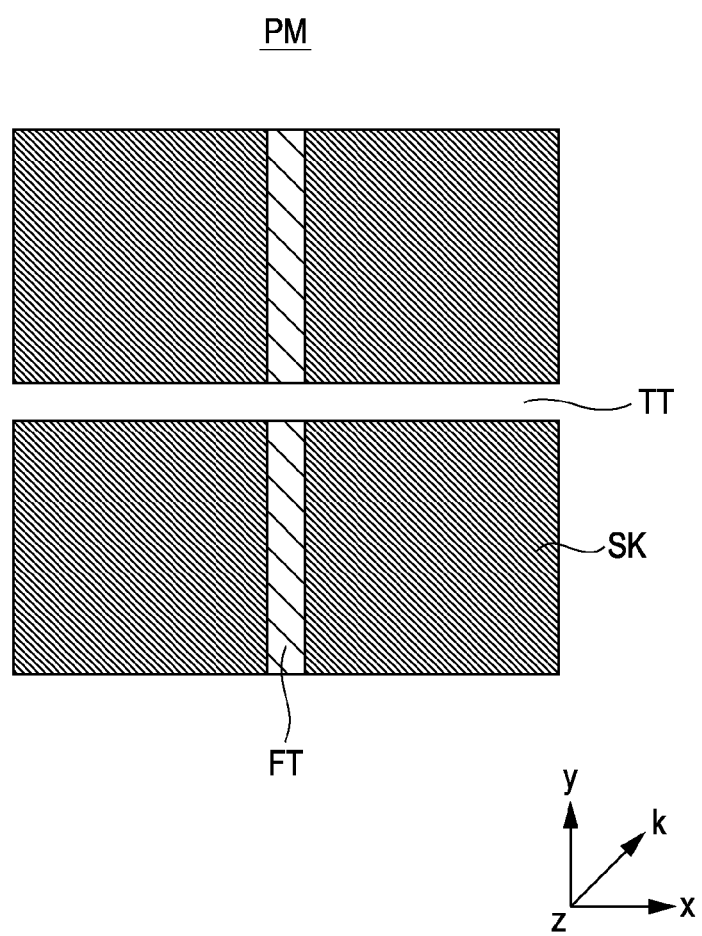

FIG. 25

| ON-CHIP LENS FILM THICKNESS ($\mu m$) | NORMALIZATION SENSITIVITY | SMEAR (dB) REF DIFFERENCE |
|---|---|---|
| 0.25 | 1 | 0 (STANDARD) |
| 0.35 | 16% IMPROVEMENT | 1.3 dB DETERIORATION |
| 0.45 | 19% IMPROVEMENT | 2.8 dB DETERIORATION |

SOLID-STATE IMAGING DEVICE, SOLID-STATE IMAGING DEVICE MANUFACTURING METHOD, ELECTRONIC DEVICE, AND LENS ARRAY

CROSS-REFERENCE TO RELATED APPLICATIONS

This application is a continuation of U.S. patent application Ser. No. 14/166,310, filed Jan. 28, 2014, which is a division of U.S. patent application Ser. No. 12/886,952, filed Sep. 21, 2010, now U.S. Pat. No. 8,686,337, which claims priority to Japanese Patent Application Serial No. JP 2009-225159, filed in the Japan Patent Office on Sep. 29, 2009, the entire disclosures of which are hereby incorporated herein by reference.

BACKGROUND OF THE INVENTION

1. Field of the Invention

The present invention relates to a solid-state imaging device, a solid-state imaging device manufacturing method, an electronic device, and a lens array.

2. Description of the Related Art

Cameras such as digital video cameras and digital still cameras include solid-state imaging devices, e.g., include CMOS (Complementary Metal Oxide Semiconductor) image sensors or CCD (Charge Coupled Device) image sensors as a solid-state imaging device.

With solid-state imaging devices, an imaging region where multiple pixels are formed is provided to the surface of the semiconductor substrate. With this imaging region, multiple photoelectric conversion units which receive light according to a subject image, and generate signal charge by subjecting the received light thereof to photoelectric conversion, are formed so as to correspond to the multiple pixels thereof. For example, photodiodes are formed as the photoelectric conversion units.

Of solid-state imaging devices, with CCD-type image sensors, a vertical transfer register unit is provided between multiple pixel columns arrayed in the vertical direction. With vertical transfer register units, multiple transfer electrodes are provided so as to face a vertical transfer channel region via a gate insulating film, which transfer signal charge read out from a photoelectric conversion unit by a charge readout unit in the vertical direction. Subsequently, the signal charge transferred for each one horizontal line (pixels in one row) by the vertical transfer register unit thereof is transferred in the horizontal direction by a horizontal transfer register unit, and is output by an output unit.

Also, of solid-state imaging devices, with CMOS-type image sensors, pixels are configured so as to include multiple transistors in addition to photoelectric conversion units. The multiple transistors are configured as a pixel transistor which reads out the signal charge generated by a photoelectric conversion unit to output this to a signal line as an electric signal. Also, with CMOS-type image sensors, in order to reduce the pixel size, it has been proposed that the pixels be configured so that the multiple photoelectric conversion units share the above pixel transistor. For example, a technique has been proposed wherein two or four photoelectric conversion units share a single pixel transistor group (e.g., see Japanese Unexamined Patent Application Publication No. 2004-172950).

With solid-state imaging devices, in general, a "front illumination" type has been familiar wherein photoelectric conversion units receive light to be input from the surface side where circuit elements and wirings and so forth are provided on the semiconductor substrate. In the case of the front illumination type, there is a case where it is difficult to improve sensitivity since a circuit element or wiring or the like shield or reflect light to be input thereto. Therefore, a "backside illumination" type has been proposed wherein photoelectric conversion units receive light to be input from the rear surface side that is the opposite side of the surface where circuit elements, wirings, and so forth are provided on the semiconductor substrate (e.g., see Japanese Unexamined Patent Application Publication No. 2003-31785).

With a solid-state imaging device such as described above, as the number of pixels increases, the cell size of each pixel becomes small. As a result thereof, light receiving amount per one pixel may decrease.

Therefore, in order to enhance the light collection efficiency and increase the amount of light received, an on-chip lens is provided. Specifically, a micro lens for focusing light onto the light-receiving surface of a photoelectric conversion unit is provides so as to correspond to each pixel (e.g., see Japanese Unexamined Patent Application Publication Nos. 2000-039503 and 2000-206310).

With micro lens forming process, for example, a micro lens material configured of a photosensitive resin is subjected to pattern processing on a flattened film (or undercoating of a micro lens) disposed on a color filter by photolithography technology. Subsequently, the processed micro lens material is subjected to bleaching exposure, and is subsequently subjected to a reflow process, and accordingly a micro lens is formed (e.g., see Japanese Unexamined Patent Application Publication Nos. 2003-222705, 2007-294779, and 2007-025383).

In addition, after a mask layer is formed on a lens material layer, a micro lens is formed by subjecting the lens material layer to etching processing using the mask layer thereof. Specifically, first, after a photosensitive resin film is formed on the lens material layer, the photosensitive resin is subjected to pattern processing by photolithography to form a resist pattern so as to correspond to a region where a micro lens is formed. Subsequently, a reflow process for heating and melting the resist pattern is carried out to transform the resist pattern thereof into the shape of the lens, thereby forming a mask layer. Subsequently, both of the resist pattern transformed into the mask layer thereof, and the lens material layer are subjected to etchback, and accordingly, the lens material layer located under the mask layer is processed into a macro lens (e.g., see Japanese Patent No. 4186238, and Japanese Unexamined Patent Application Publication No. 2007-53318).

SUMMARY OF THE INVENTION

However, in the event that a micro lens is formed by subjecting the pattern-processed lens material layer to a reflow process (in the case of the former manufacturing method), an inconvenience may be caused, such as increase in cost, difficulty in manufacturing in a stable manner, or the like. In particular, in order to prevent adjacent micro lenses from being fused and the shapes thereof from collapsing by the reflow process, when taking various types of measures, occurrence of this inconvenience becomes prominent. For example, increase in cost may be caused due to having to use an expensive photo mask (Japanese Unexamined Patent Application Publication No. 2007-316153), increase in the number of processes, having to invest in facilities, or the like. Also, a product may not readily be manufactured in a stable manner due to unevenness between material lots of new materials, or unevenness between process conditions (e.g., see Japanese Unexamined Patent Application Publication Nos. 2000-206310, 2003-222705, 2007-316153, and 2007-294779).

Also, even when forming a micro lens by subjecting the lens material layer to etchback using a mask layer processed into a lens shape (in the case of the latter manufacturing method), the same inconvenience as the above may be caused. With this manufacturing method, the effective areas of micro lenses can readily be enlarged, but distance between the micro lenses is longer in the diagonal directions of the lenses compared to the side directions, and accordingly, etchback has to be performed for a long time, which incurs deterioration in dark current or the like, and the image quality of an imaged image may deteriorate (e.g., see Japanese Unexamined Patent Application Publication No. 2007-025383 and Japanese Patent No. 4186238).

Thus, with micro lens manufacturing, it may be difficult to form micro lens with high precision, and focusing efficiency may not readily be improved. Further, inconvenience may be caused such as increase in cost, deterioration in manufacturing efficiency, or the like.

The image quality of an imaged image may deteriorate due to the above causes. Specifically, in the case of a CCD type, inconvenience may occur, such as deterioration in sensitivity, occurrence of smear, shading, or color mixture, or the like.

FIG. 25 is a diagram illustrating the results of optical simulation by FTDT (Finite Difference Time Domain). Here, with a CCD solid-state imaging device, the results of sensitivity and smear property in the event that of changing the film thickness of a micro lens with the pixel size being a tetragonal lattice of 1.55 µm.

As illustrated in FIG. 25, when increasing the film thickness of a micro lens, the sensitivity increases, but the smear property deteriorates. Therefore, both of the properties are not readily improved, and image quality is not readily improved.

Also, in the case of a CMOS type, inconvenience may be caused, such as deterioration in sensitivity, occurrence of color mixture, or the like. In particular, in the case of the above "backside illumination" type, occurrence of inconvenience due to color mixture between adjacent pixels may become prominent. Thus, it may be difficult to improve the image quality of an imaged image.

It has been found to be desirable to provide a solid-state imaging device, a solid-state imaging device manufacturing method, an electronic device, and a lens array, whereby focusing efficiency can be improved by forming a micro lens with high precision, and the image quality of an imaged image can readily be improved.

An embodiment of the present invention is a solid-state imaging device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a plurality of micro lenses, which are disposed in each of the first direction and the second direction above each light-receiving surface of the plurality of photoelectric conversion units, configured to focus the incident light onto the light-receiving surface; and a transfer unit, which is provided for each column of the plurality of photoelectric conversion units arrayed in the second direction of the plurality of photoelectric conversion units, where a transfer channel region configured to transfer signal charge generated at this photoelectric conversion unit in the second direction is formed on the imaging face; with the plurality of micro lenses of which the planar shape of the imaging face is a shape including a portion divided by a side extending in the first direction and a side extending in the second direction being disposed so as to be arrayed mutually adjacent to each of the first direction and the second direction; and with the plurality of micro lenses being formed so that the depth of a groove between micro lenses arrayed in a third direction inclined in the first direction and the second direction of the imaging face is deeper than the depth of a groove between micro lenses arrayed in the first direction, and also the curvature of the lens surface in the third direction is higher than the curvature of the lens surface in the first direction.

The plurality of micro lenses may be formed so that the depth of a groove between micro lenses arrayed in the second direction is deeper than the depth of a groove between micro lenses arrayed in the first direction, and also the curvature of the lens surface in the second direction is formed so as to be higher than the curvature of the lens surface in the first direction.

With the plurality of micro lenses, depth D1 of a groove between micro lenses arrayed in the first direction, and depth D3 of a groove between micro lenses arrayed adjacent to the third direction may have a relation of D1:D3=1:3 to 5.

With the plurality of micro lenses, depth D1 of a groove between micro lenses arrayed in the first direction may have a relation of D1≤150 nm.

An embodiment of the present invention is a solid-state imaging device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a micro lens, which is disposed above each light-receiving surface of the plurality of photoelectric conversion units, configured to focus the incident light onto the light-receiving surface; and a transfer unit, which is provided for each column of the plurality of photoelectric conversion units arrayed in the second direction of the plurality of photoelectric conversion units, where a transfer channel region configured to transfer signal charge generated at this photoelectric conversion unit in the second direction is formed on the imaging face; with the micro lens being formed so that the lens surface to which the incident light is input becomes a curved surface in the second direction, and becomes a planar surface in the first direction.

An embodiment of the present invention is a solid-state imaging device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a plurality of micro lenses, which are disposed in each of the first direction and the second direction above each light-receiving surface of the plurality of photoelectric conversion units, configured to focus the incident light onto the light-receiving surface; and a pixel transistor, which is provided between the plurality of photoelectric conversion units of the imaging face, configured to read out and output signal charge generated at the plurality of photoelectric conversion units; with the plurality of micro lenses of which the planar shape of the imaging face is a shape including a portion divided by a side extending in the first direction and a side extending in the second direction being disposed so as to be arrayed mutually adjacent to each of the first direction and the second direction; and with the plurality of micro lenses being formed so that the depth of a groove between micro lenses corresponding to a portion where the plurality of photoelectric conversion units are arrayed without the pixel transistor introduced therebetween at the imaging face is deeper than the depth of a groove between micro lenses of other portions, and also the curvature of the lens surface on the side of a portion where the plurality of photoelectric conversion units are arrayed without the plurality of pixel transistors introduced therebetween is higher than the curvature of the lens surface of other portions.

An embodiment of the present invention is a solid-state imaging device manufacturing method including: first forming, of a plurality of photoelectric conversion units which receive incident light at a receiving surface to generate signal charge so as to be arrayed in each of a first direction and a second direction orthogonal to the first direction of an imaging face of a substrate; second forming, of a transfer unit where a transfer channel region transfers signal charge to be generated at the plurality of photoelectric conversion units in the second direction, for each column of the plurality of photoelectric conversion units arrayed in the second direction of the plurality of photoelectric conversion units; and third forming, of a plurality of micro lenses which focus the incident light onto the light-receiving surface so that the plurality of micro lenses are arrayed in each of the first direction and the second direction above each light-receiving surface of the plurality of photoelectric conversion units; with the plurality of micro lenses being formed in the third forming so that the planar shape of the imaging face is a shape including a portion divided by a side extending in the first direction and a side extending in the second direction are disposed so as to be arrayed mutually adjacent to each of the first direction and the second direction; and with the plurality of micro lenses being formed so that the depth of a groove between micro lenses arrayed in a third direction inclined in the first direction and the second direction of the imaging face is deeper than the depth of a groove between micro lenses arrayed in the first direction, and also the curvature of the lens surface in the third direction is higher than the curvature of the lens surface in the first direction.

The third forming may include: fourth forming, of a lens material layer on the substrate; fifth forming, of a resist pattern on the lens material layer; a heating reflow process, of the resist pattern; and lens material layer processing, of the resist pattern subjected to the heating reflow process and the lens material layer, by performing an etchback process, so as to pattern-process the lens material layer into the micro lens.

The heating reflow process may be carried out regarding the resist pattern so that resist patterns arrayed adjacent to the third direction of the imaging face maintain a separated state, and also resist patterns arrayed in the first direction are mutually fused.

In the heating reflow process, a post bake process may be carried out a plurality of number of times as the heating reflow process so that of the post bake processes of the plurality of number of times, a post bake process carried out later is higher in heat processing temperature than a post bake process carried out earlier.

In the third forming, the plurality of micro lenses may be formed so that the depth of a groove between micro lenses arrayed in the second direction is deeper than the depth of a groove between micro lenses arrayed in the first direction, and also the curvature of the lens surface in the second direction is higher than the curvature of the lens surface in the first direction.

An embodiment of the present invention is a solid-state imaging device manufacturing method including: first forming, of a plurality of photoelectric conversion units which receive incident light at a receiving surface to generate signal charge so as to be arrayed in each of a first direction and a second direction orthogonal to the first direction of an imaging face of a substrate; second forming, of a transfer unit where a transfer channel region transfers signal charge to be generated at the plurality of photoelectric conversion units in the second direction, for each column of the plurality of photoelectric conversion units arrayed in the second direction of the plurality of photoelectric conversion units; and third forming, of a plurality of micro lenses which focus the incident light onto the light-receiving surface above each light-receiving surface of the plurality of photoelectric conversion units; with the plurality of micro lenses being formed in the micro lens forming step, so that the lens surface to which the incident light is input becomes a curved surface in the second direction, and becomes a planar surface in the first direction.

An embodiment of the present invention is a solid-state imaging device manufacturing method including: first forming, of a plurality of photoelectric conversion units which receive incident light at a receiving surface to generate signal charge so as to be arrayed in each of a first direction and a second direction orthogonal to the first direction of an imaging face of a substrate; second forming, of a pixel transistor which reads out and outputs signal charge generated at the plurality of photoelectric conversion units, between the plurality of photoelectric conversion units of the imaging face; and third forming, of a plurality of micro lenses which focus the incident light onto the light-receiving surface so that the plurality of micro lenses are arrayed in each of the first direction and the second direction above each light-receiving surface of the plurality of photoelectric conversion units; with the plurality of micro lenses being formed in the micro lens forming step, so that the planar shape of the imaging face is a shape including a portion divided by a side extending in the first direction and a side extending in the second direction are disposed so as to be arrayed mutually adjacent to each of the first direction and the second direction; and with the plurality of micro lenses being formed so that the depth of a groove between micro lenses corresponding to a portion where the plurality of photoelectric conversion units are arrayed without the plurality of pixel transistors introduced therebetween at the imaging face is deeper than the depth of a groove between micro lenses of other portions, and also the curvature of the lens surface in a portion where the plurality of photoelectric conversion units are arrayed without the plurality of pixel transistors introduced therebetween is higher than the curvature of the lens surface of other portions.

An embodiment of the present invention is an electronic device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a plurality of micro lenses, which are disposed in each of the first direction and the second direction above each light-receiving surface of the plurality of photoelectric conversion units, configured to focus the incident light onto the light-receiving surface; and a transfer unit, which is provided for each column of the plurality of photoelectric conversion units arrayed in the second direction of the plurality of photoelectric conversion units, where a transfer channel region configured to transfer signal charge generated at this photoelectric conversion unit in the second direction is formed on the imaging face; with the plurality of micro lenses of which the planar shape of the imaging face is a shape including a portion divided by a side extending in the first direction and a side extending in the second direction being disposed so as to be arrayed mutually adjacent to each of the first direction and the second direction; and with the plurality of micro lenses being formed so that the depth of a groove between micro lenses arrayed in a third direction inclined in the first direction and the second direction of the imaging face is deeper than the depth of a groove between micro lenses arrayed in the first direction, and also the curvature of the lens surface in the third direction is higher than the curvature of the lens surface in the first direction.

An embodiment of the present invention is an electronic device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a micro lens, which is disposed above the light-receiving surfaces of the plurality of photoelectric conversion units, configured to focus the incident light onto the light-receiving surface; and a transfer unit, which is provided for each column of the plurality of photoelectric conversion units arrayed in the second direction of the plurality of photoelectric conversion units, where a transfer channel region configured to transfer signal charge generated at this photoelectric conversion unit in the second direction is formed on the imaging face; with the micro lens being formed so that the lens surface to which the incident light is input becomes a curved surface in the second direction, and becomes a planar surface in the first direction.

An embodiment of the present invention is an electronic device including: a plurality of photoelectric conversion units, which are disposed so as to be arrayed in each of a first direction and a second direction orthogonal to the first direction of an imaging face of a substrate, configured to receive incident light at a light-receiving surface to generate signal charge; a plurality of micro lenses, which are disposed in each of the first direction and the second direction above each light-receiving surface of the plurality of photoelectric conversion units, configured to focus the incident light onto the light-receiving surface; and a pixel transistor, which is provided between the plurality of photoelectric conversion units of the imaging face, configured to read out and output signal charge generated at the plurality of photoelectric conversion units; with the plurality of micro lenses of which the planar shape at the imaging face is a shape including a portion divided by a side extending in the first direction and a side extending in the second direction being disposed so as to be arrayed mutually adjacent to each of the first direction and the second direction; and with the plurality of micro lenses being formed so that the depth of a groove between micro lenses corresponding to a portion where the plurality of photoelectric conversion units are arrayed without the pixel transistor introduced therebetween at the imaging face is deeper than the depth of a groove between micro lenses of other portions, and also the curvature of the lens surface in a portion where the plurality of photoelectric conversion units are arrayed without the pixel transistor introduced therebetween is higher than the curvature of the lens surface of other portions.

An embodiment of the present invention is a lens array including: a plurality of micro lenses, which are disposed so as to be arrayed in each of a first direction and a second direction orthogonal to the first direction, configured to focus incident light; with the plurality of micro lenses of which the planar shape is a shape including a portion divided by a side extending in the first direction and a side extending in the second direction being disposed so as to be arrayed mutually adjacent to each of the first direction and the second direction; and with the plurality of micro lenses being formed so that the depth of a groove between micro lenses arrayed in a third direction inclined in the first direction and the second direction is deeper than the depth of a groove between micro lenses arrayed in the first direction, and also the curvature of the lens surface in the third direction is higher than the curvature of the lens surface in the first direction.

The plurality of micro lenses may be formed so that the depth of a groove between micro lenses arrayed in the second direction is deeper than the depth of a groove between micro lenses arrayed in the first direction, and also the curvature of the lens surface in the second direction is higher than the curvature of the lens surface in the first direction.

With the above configurations, the micro lenses are high in the curvature of the micro lenses in the diagonal direction (the lens thickness is thick), and accordingly, for example, can effectively focus incident light onto the light-receiving surface from the diagonal direction where smear is prevented from occurring with a CCD type. Subsequently, sensitivity can be improved along with this.

According to the above configurations, a solid-state imaging device, a solid-state imaging device manufacturing method, an electronic device, and a lens array can be provided, wherein focusing efficiency can be improved by forming micro lenses with high precision, and the image quality of an imaged image can readily be improved.

BRIEF DESCRIPTION OF THE DRAWINGS

FIG. 4 is a diagram illustrating a color filter according to the first embodiment of the present invention;

FIG. 9 is a diagram illustrating a photo mask to be used at a resist pattern forming process according to the first embodiment of the present invention;

FIG. 12 is a diagram illustrating a photo mask to be used at a resist pattern forming process according to the second embodiment of the present invention;

FIG. 25 is a diagram illustrating the results of an optical simulation by FTDT.

DESCRIPTION OF THE PREFERRED EMBODIMENTS

Hereafter, embodiments of the present invention will be described with reference to the drawings. Note that description will be made in accordance with the following sequence.

1. First Embodiment (Case where the curvature in the diagonal direction of OCL is higher than that in the horizontal direction at a CCD type)

2. Second Embodiment (Case where the curvature in the diagonal and vertical directions of OCL is higher than that in the horizontal direction at the CCD type)

3. Third Embodiment (Case where the shape of OCL is a dome-like shape at the CCD type)

4. Fourth Embodiment (Case of a CMOS type)

5. Others

1. First Embodiment

A. Device Configuration, Etc.

A-1. Principal Portion Configuration of a Camera

Figure 1:
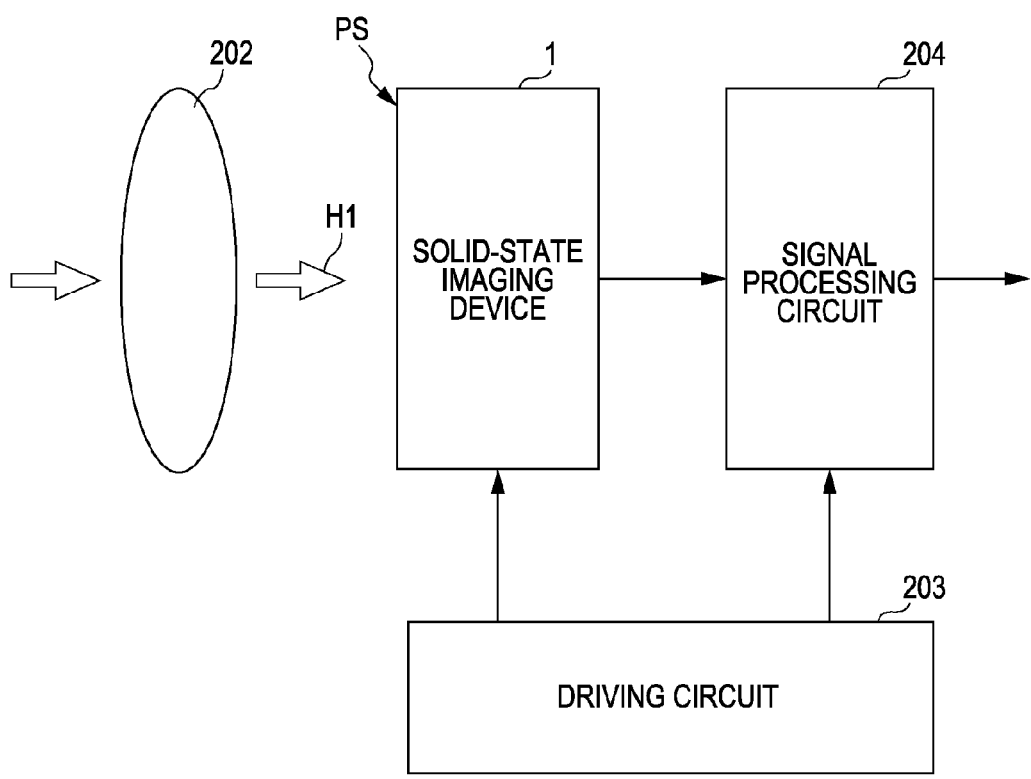
FIG. 1 is a configuration diagram illustrating the configuration of a camera according to a first embodiment according of the present invention.

FIG. 1 is a configuration diagram illustrating the configuration of a camera 200 according to a first embodiment of the present invention. As illustrated in FIG. 1, the camera 200 includes a solid-state imaging device 1, an optical system 202, a driving circuit 203, and a signal processing circuit 204.

The solid-state imaging device 1 is configured so as to output signal charge generated by imaging light (subject image) H to be input via the optical system 202 at an imaging face PS, as raw data. The detailed configuration of the solid-state imaging device 1 will be described later.

The optical system 202 includes, for example, an optical lens and diaphragm, and carries out image formation of the input light H on the imaging face PS of the solid-state imaging device 1.

The driving circuit 203 outputs various types of driving signals to the solid-state imaging device 1 and the signal processing circuit 204 to drive the solid-state imaging device 1 and the signal processing circuit 204, respectively.

The signal processing circuit 204 generates a digital image regarding a subject image by subjecting the raw data output from the solid-state imaging device 1 to signal processing.

A-2. Overall configuration of the solid state imaging device

Figure 2:
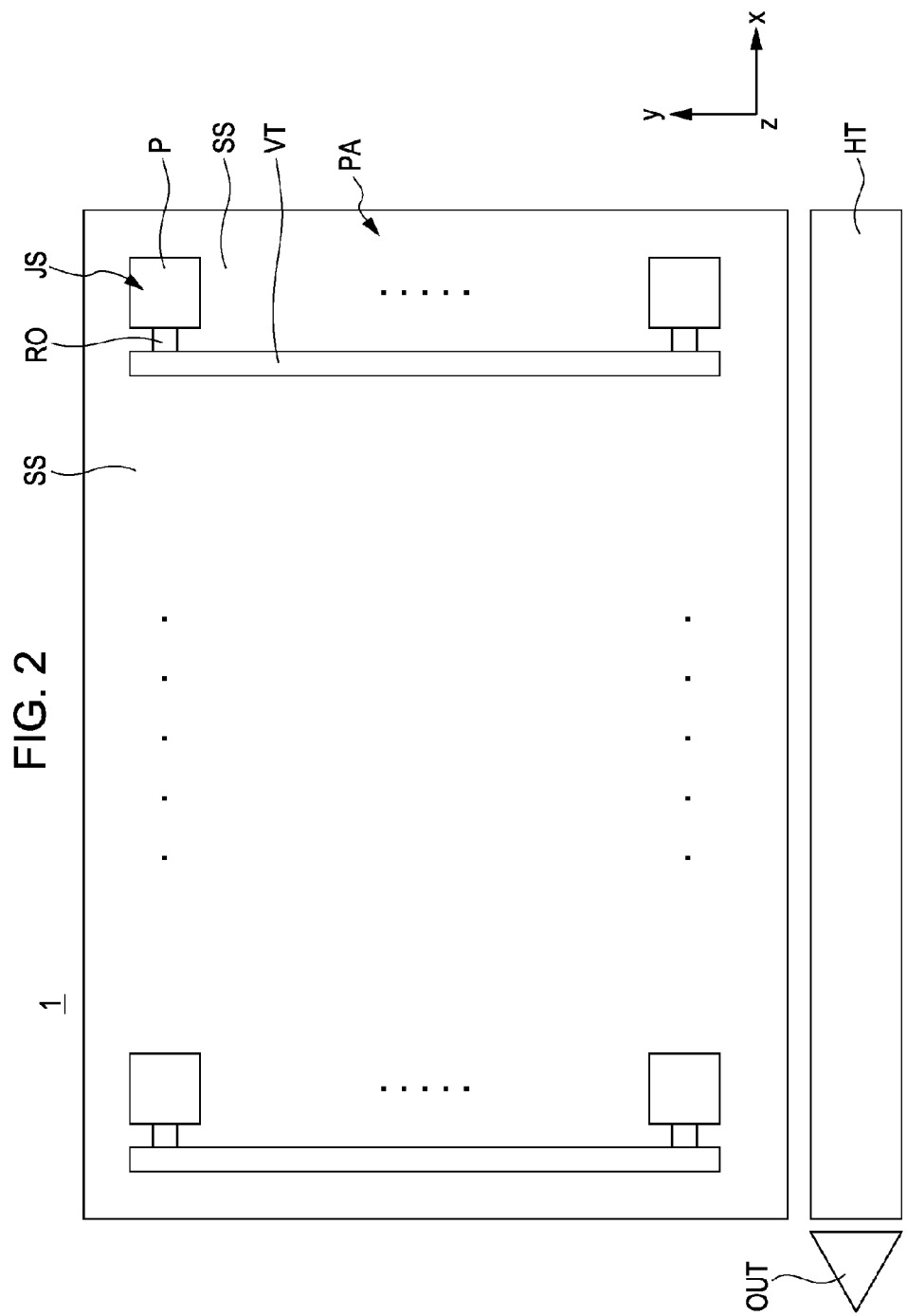
FIG. 2 is a plan view schematically illustrating the overall configuration of a solid-state imaging device according to the first embodiment of the present invention.

FIG. 2 is a plan view schematically illustrating the overall configuration of the solid-state imaging device 1 according to the first embodiment of the present invention. As illustrated in FIG. 2, the solid-state imaging device 1 is, for example, a CCD-type image sensor according to the interline method, and a subject image is imaged in an imaging region PA.

With the imaging region PA, such as illustrated in FIG. 2, a pixel P, a charge readout unit RO, and a vertical transfer register unit VT are formed.

As illustrated in FIG. 2, multiple pixels P are provided to the imaging region PA, and each of the pixels P is disposed so as to be arrayed in a matrix manner in a horizontal direction x and in a vertical direction y. Each of the pixels P includes a photoelectric conversion element, where light is received at a light-receiving surface JS to generate signal charge. Subsequently, with the circumference of the multiple pixels P, an element separating unit SS is provided so as to separate the pixels P. Subsequently, each of the pixels P is configured to generate signal charge by receiving light serving as a subject image at the light-receiving surface JS to perform photoelectric conversion.

Multiple charge readout units RO are provided so as to correspond to the multiple pixels P on the imaging region PA such as illustrated in FIG. 2, and are configured to read out the signal charge generated at the pixel P thereof to the vertical transfer register unit VT thereof.

The vertical transfer register unit VT extends in a vertical direction y so as to correspond to the multiple pixels P arrayed in the vertical direction y on the imaging region PA, such as illustrated in FIG. 2. Also, the vertical transfer register unit VT is disposed between the columns of the pixels P arrayed in the vertical direction y. Two or more vertical transfer register units VT are provided to the imaging region PA, and are arrayed in a horizontal direction x so as to correspond to the multiple pixels P arrayed in the horizontal direction x respectively. Each of the vertical transfer register units VT is a vertical transfer CCD, wherein signal charge is read out from the pixel P thereof via the charge readout unit RO thereof, and is transferred in the vertical direction y. With each of the vertical transfer register units VT, multiple transfer electrodes (not illustrated) are disposed so as to be arrayed in the vertical direction y, and for example, a 4-phase driving pulse signal is sequentially supplied to the transfer electrodes arrayed in the vertical direction, thereby transferring the signal charge. That is to say, each of the vertical transfer register units VT is provided for each column of the multiple pixels P arrayed in the vertical direction y of the multiple pixels P, and a transfer channel region is formed on the imaging face wherein the signal charge generated at each of the pixels P is transferred in the vertical direction y.

With the lower edge portion of the imaging region PA, such as illustrated in FIG. 2, a horizontal transfer register unit HT is disposed. This horizontal transfer register unit HT extends in the horizontal direction x, and sequentially transfers the signal charge transferred in the vertical direction y from each of the multiple vertical transfer register units VT. That is to say, the horizontal transfer register unit HT is a horizontal transfer CCD, and is driven by a two-phase driving pulse signal to transfer the signal charge transferred for each horizontal line (pixels in one row).

With the left edge portion of the horizontal transfer register unit HT, such as illustrated in FIG. 2, an output unit OUT is formed, and this output unit OUT converts the signal charge horizontally transferred by the horizontal transfer register unit HT into voltage, and outputs this as an analog image signal. Note that the above imaging region PA is equivalent to the imaging face PS illustrated in FIG. 1.

A-3. Detailed Configuration of the Solid-State Imaging Device

Figure 3:
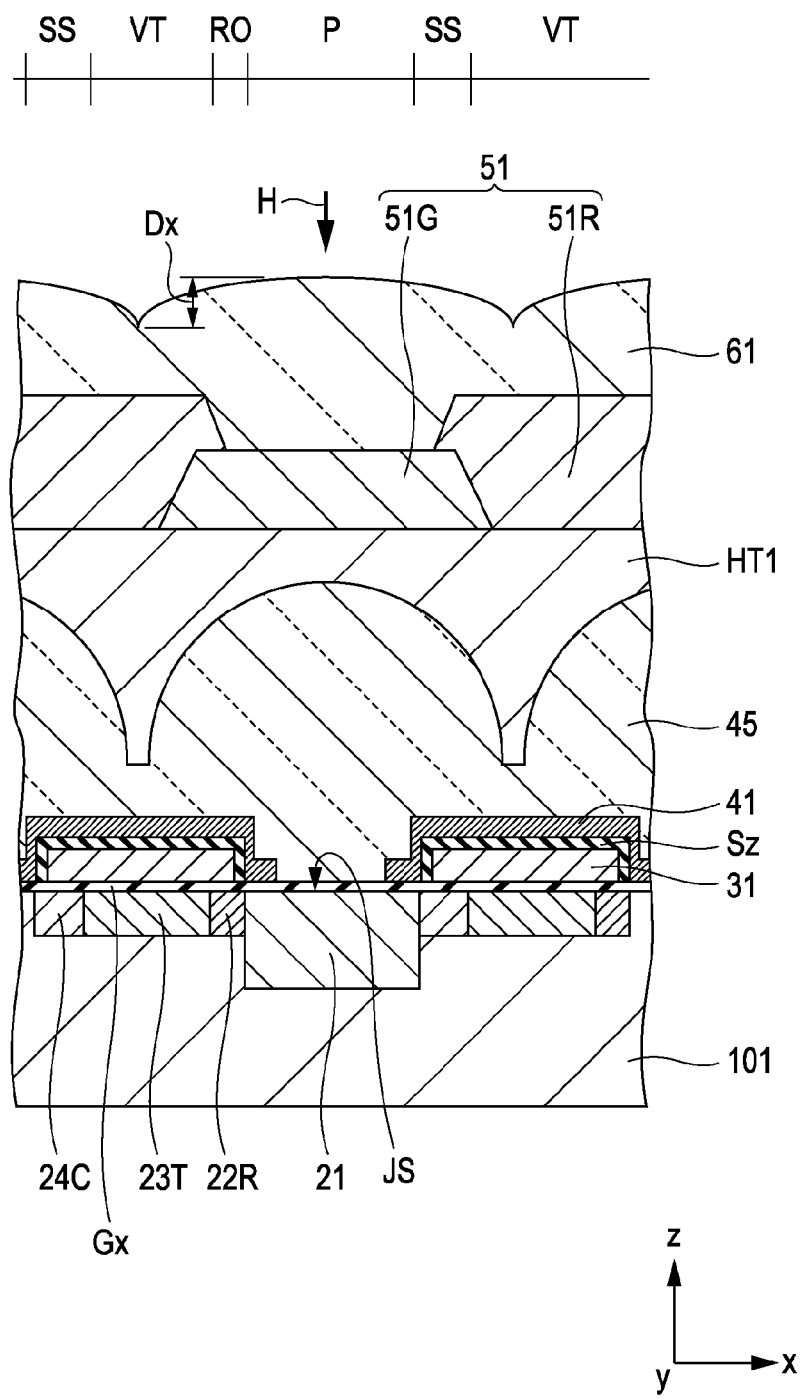
FIG. 3 is a diagram illustrating the principal portions of the solid-state imaging device according to the first embodiment of the present invention.

The detailed configuration of the above solid-state imaging device 1 will be described. FIG. 3 is a diagram illustrating the principal portions of the solid-state imaging device 1 according to the first embodiment of the present invention. Here, FIG. 3 illustrates the cross-section of the principal portions.

The solid-state imaging device 1 includes, such as illustrated in FIG. 3, a substrate 101. The substrate 101 is, for example, an n-type silicon semiconductor substrate, and a photodiode 21, a charge readout channel region 22R, a charge transfer channel region 23T, and a channel stopper region 24C are provided within this substrate 101.

As illustrated in FIG. 3, a transfer electrode 31, a metal light-shielding film 41, an intra-layer lens 45, a color filter 51, and a micro lens 61 are provided to the surface of the substrate 101. Each unit making up the solid-state imaging device 1 will be described in order.

(1) About the Photodiode 21

Photodiodes 21 are, such as illustrated in FIG. 3, provided to the substrate 101 so as to correspond to the pixels P. That is to say, the multiple photodiodes 21 are disposed so as to be arrayed in each of the horizontal direction x and the vertical direction y orthogonal to the horizontal direction x on the imaging face of the substrate 101. This photodiode 21 is configured to receive light at the light-receiving surface JS, and subject the light to photoelectric conversion, thereby generating signal charge.

Specifically, the photodiode 21 is provided to a portion located on the surface side within the substrate 101. Though drawing thereof is omitted, the photodiode 21 is configured by an n-type semiconductor region (n) (not illustrated) and a p-type semiconductor region (p+) (not illustrated) being sequentially formed on the p-type semiconductor well region (p) (not illustrated) formed within the substrate 101, for example.

Here, the n-type semiconductor region (n) serves as a signal charge accumulation region. The p-type semiconductor region (p+) serves as a positive hole accumulation region, and is configured so as to prevent dark current from occurring on the n-type semiconductor region (n) that is a signal charge accumulation region.

With the photodiode 21, an intra-layer lens 45, a color filter 51, a micro lens 61, and so forth are provided above the light-receiving surface JS using a material for transmitting light. Therefore, the photodiode 21 sequentially receives light H to be input via each of these at the light-receiving surface JS to generate signal charge.

(2) About the Charge Readout Channel Region 22R

The charge readout channel region 22R is, such as illustrated in FIG. 3, provided so as to correspond to the charge readout unit RO, and is configured to read out the signal charge generated at the photodiode 21.

Specifically, the charge readout channel region 22R is, such as illustrated in FIG. 3, provided so as to be adjacent to the photodiode 21 at a portion located on the surface side within the substrate 101.

Here, the charge readout channel region 22R is disposed on the left side of the photodiode 21 in the horizontal direction x. For example, the charge readout channel region 22R is configured as a p-type semiconductor region.

(3) About the Charge Transfer Channel Region 23T

The charge transfer channel region 23T is, such as illustrated in FIG. 3, provided so as to correspond to the vertical transfer register unit VT, and is configured to transfer the signal charge read out from the photodiode 21 by the charge readout unit RO using the charge transfer channel region 23T.

Specifically, the charge transfer channel region 23T is, such as illustrated in FIG. 3, provided adjacent to the charge readout channel region 22R on a portion located on the surface side within the substrate 101.

Here, the charge transfer channel region 23T is disposed on the left side of the charge readout channel region 22R in the horizontal direction x. For example, the charge transfer channel region 23T is configured by providing the n-type semiconductor region (n) (not illustrated) above the p-type semiconductor region (p) (not illustrated) within the substrate 101.

(4) About the Channel Stopper Region 24C

The channel stopper region 24C is, such as illustrated in FIG. 3, provided so as to correspond to the element separating unit SS. Specifically, the channel stopper region 24C is, such as illustrated in FIG. 3, provided to a portion located on the surface side within the substrate 101.

Here, the channel stopper region 24C is provided on the left side of the charge readout channel region 22R in the horizontal direction x such as illustrated in FIG. 2 so as to be introduced between the charge readout channel region 22R and the photodiode 21 disposed in an adjacent column. In addition, the channel stopper region 24C is provided so as to correspond to the element separating unit SS of two photodiodes 21 arrayed in the vertical direction y (see FIG. 2).

This channel stopper region 24C is configured, for example, by providing the p-type semiconductor region (p+) (not illustrated) above the p-type semiconductor well region (p) (not illustrated) within the substrate 101, and preventing signal charge from inflow/outflow by forming a potential barrier.

(5) About the Transfer Electrode 31

The transfer electrode 31 is, such as illustrated in FIG. 3, provided so as to face the surface of the substrate 101 via a gate insulating film Gx. The transfer electrode 31 is formed of an electroconductive material. For example, the transfer electrode 31 is formed using an electrical conducting material such as polysilicon, and is provided on the gate insulating film Gx formed of a silicon dioxide film, for example.

(6) About the Metal Light-Shielding Film 41

The metal light-shielding film 41 is, such as illustrated in FIG. 3, formed above the charge readout channel region 22R and the charge transfer channel region 23T on the surface of the substrate 101, and shields light input to the charge readout channel region 22R and the charge transfer channel region 23T. Also, the metal light-shielding film 41 is, such as illustrated in FIG. 3, provided so as to cover the transfer electrode 31 via an insulating film Sz.

Here, metal light-shielding films 41 are formed in a region other than a region corresponding to the light-receiving surface JS, above the substrate 101. Each of the metal light-shielding films 41 is formed of a light-shielding material for shielding light. For example, the metal light-shielding film 41 is formed using a metal material such as tungsten, aluminum, or the like.

(7) About the Intra-Layer Lens 45

The intra-layer 45 is, such as illustrated in FIG. 3, provided so as to correspond to the light-receiving surface JS above the surface of the substrate 101. Two or more intra-layer lenses 45 are arrayed with the same shape so as to correspond to the multiple pixels P arrayed in the imaging region PA.

Here, the intra-layer lens 45 is a convex lens formed with the center being thicker than the edge in a direction from the light-receiving surface JS to the color filter 51 side, and is configured to focus the incident light H onto the center of the light-receiving surface JS.

(8) About the Color Filter 51

The color filter 51 is, such as illustrated in FIG. 3, provided so as to face the light-receiving surface JS via the intra-layer lens 45 above the surface of the substrate 101. The color filter 51 is provided on the upper surface of flattening film HT1 for flattening the surface of the intra-layer lens 45. Here, the color filter 51 is configured to color the incident light H to transmit this to the light-receiving surface JS.

FIG. 4 is a diagram illustrating the color filter 51 according to the first embodiment of the present invention. Here, FIG. 4 illustrates the upper surface thereof. As illustrated in FIG. 4, the color filter 51 includes a blue filter layer 51B in addition to the green filter layer 51G and red filter layer 51R illustrated in FIG. 3. Two or more green filter layers 51G, red filter layers 51R, and blue filter layers 51B are each arrayed so as to correspond to the multiple pixels P arrayed on the imaging region PA. With the present embodiment, such as illustrated in FIG. 4, each of the layers 51R, 51G, and 51B is disposed in a Bayer array.

Each of the layers 51R, 51G, and 51B is formed by being applied using coating liquid containing pigment according to each color, a dispersion resin, a photopolymerization initiator, a multifunctional photopolymerization compound, a solvent, and other additives, then dried, and then being subjected to pattern processing by the lithography technology.

(9) About the Micro Lens 61

The micro lens 61 is, such as illustrated in FIG. 3, provided above each light-receiving surface JS of the multiple photodiodes 21, above the color filter 51.

Figure 5A:
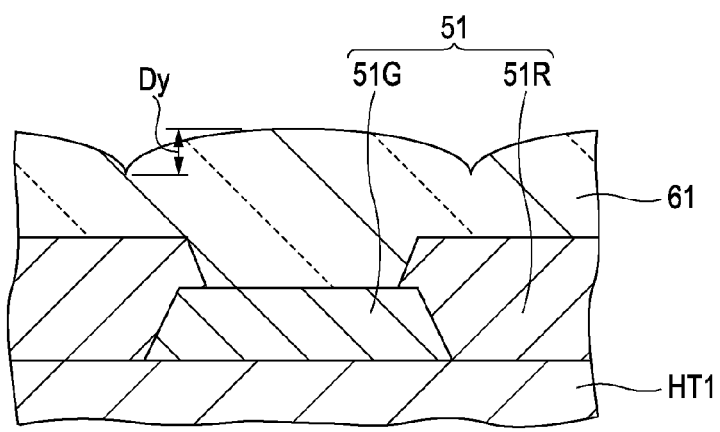
FIGS. 5A and 5B are diagrams illustrating a micro lens according to the first embodiment of the present invention.
Figure 5B:
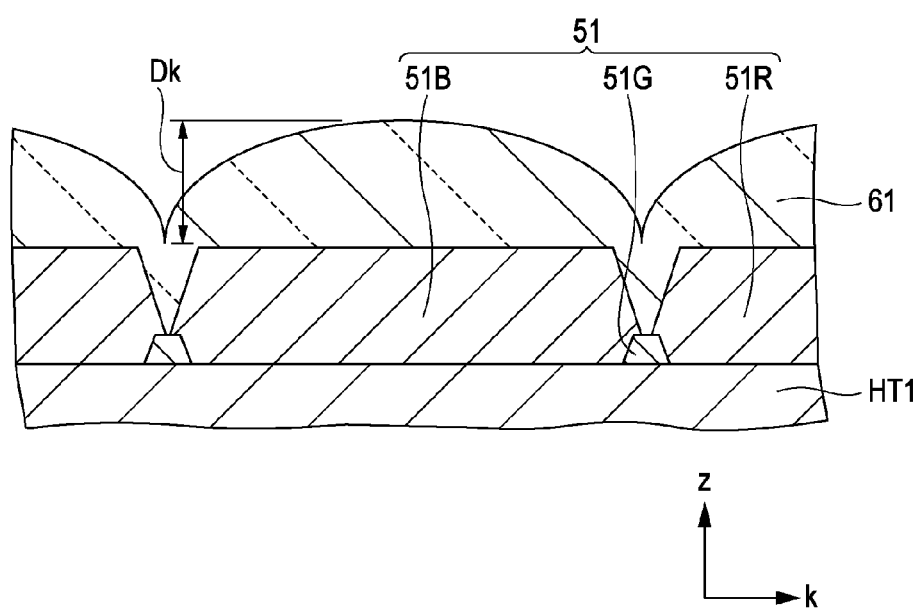
Figure 6:
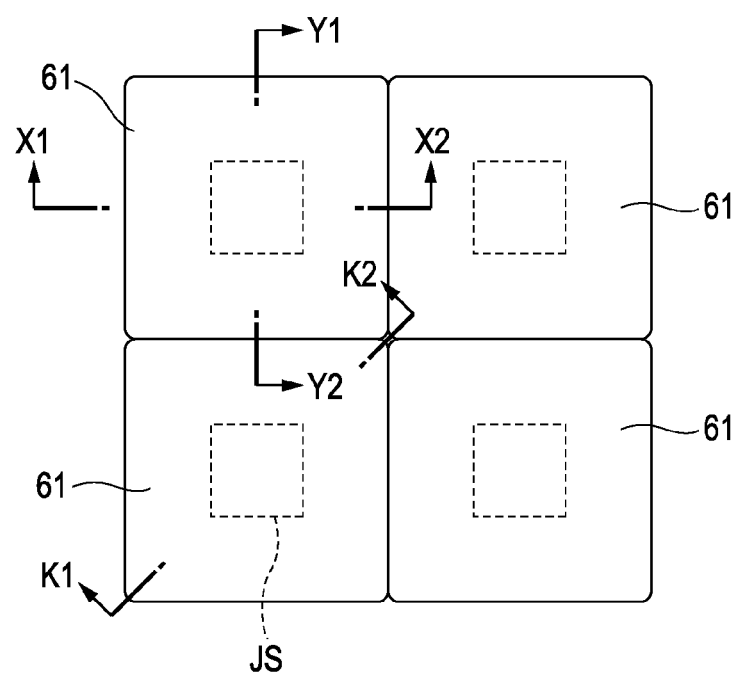
FIG. 6 is a diagram illustrating the micro lens according to the first embodiment of the present invention.

FIGS. 5A, 5B, and 6 are diagrams illustrating the micro lens 61 according to the first embodiment of the present invention. Here, FIGS. 5A and 5B illustrate the cross-section thereof, and FIG. 6 illustrates the upper surface thereof. Specifically, FIG. 5A illustrates the cross-section (Y1-Y2 portion) in the vertical direction y illustrated in FIG. 6, and FIG. 5B illustrates the cross-section (K1-K2 portion) in the diagonal direction k illustrated in FIG. 6. Also, the above FIG. 3 illustrates the cross-section (X1-X2 portion) in the horizontal direction x illustrated in FIG. 6.

As illustrated in FIGS. 3 and 5, the micro lens 61 is a convex lens formed with the center being thicker than the edge in the depth-wise direction z from the light-receiving surface JS toward the color filter 51 side, and is configured to focus the incident light H onto the center of the light-receiving surface JS.

Also, such as illustrated in FIG. 6, multiple micro lenses 61 are provided in each of the horizontal direction x and the vertical direction y. The multiple micro lenses 61 are disposed so as to correspond to the multiple pixels P arrayed in the imaging region PA, respectively (see FIG. 2). That is to say, the multiple micro lenses 61 are disposed in each of the horizontal direction x and the vertical direction y in the same way as with the multiple photodiodes 21, and make up a lens array.

As illustrated in FIG. 6, the micro lens 61 is formed so as to have a shape including a portion obtained by the planar shape of the imaging face being divided by a side extending in the horizontal direction x, and a side extending in the vertical direction y. That is to say, each of the micro lenses 61 is formed so that the planar shape becomes a square shape.

The multiple micro lenses 61 are, such as illustrated in FIGS. 3 and 6, each disposed so as to be arrayed mutually adjacent to each of the horizontal direction x and the vertical direction y.

Here, of the multiple micro lenses 61, the micro lenses 61 arrayed adjacent to the horizontal direction x are formed so as to mutually come into contact with a side extending in the vertical direction y. Also, of the multiple micro lenses 61, the micro lenses 61 arrayed adjacent to the vertical direction y are formed so as to come into contact with each other at a side extending in the horizontal direction x, such as illustrated in FIGS. 5A and 6.

The micro lenses 61 arrayed in each of the horizontal direction x and the vertical direction y are formed so the lens surface becomes the same such as illustrated in FIGS. 3 and 5A. Specifically, each of the micro lenses 61 is formed so that the curvature of the lens surface becomes the same in the cross-section in each of the horizontal direction x and the vertical direction y. Also, each of the micro lenses 61 is formed so that the depths Dx and Dy of the grooves formed between the micro lenses 61 become the same in the cross-section in each of the horizontal direction x and the vertical direction y.

On the other hand, of the multiple micro lenses 61, the micro lenses 61 arrayed adjacent to the diagonal direction k are formed so as to come into contact with each other at a portion where a side extending in the horizontal direction x and a side extending in the vertical direction y intersect, such as illustrated in FIGS. 3 and 5B.

The lens surfaces of the micro lenses 61 arrayed in the diagonal direction k differ in curvature from the lens surfaces of the micro lenses 61 in the horizontal direction x and the vertical direction y, such as illustrated in FIG. 5B. Here, the lens surfaces of the micro lenses 61 arrayed in the diagonal direction k are formed so that the curvature thereof is higher than that of the lens surfaces of the micro lenses 61 in the horizontal direction x and the vertical direction y.

Also, the depth Dk of a groove formed between the micro lenses 61 arrayed in the diagonal direction k is formed so as to be deeper than the depths Dx and Dy of grooves formed between the micro lenses 61 arrayed in the horizontal direction x and the vertical direction y. Note that the depths Dx, Dy, and Dk of the grooves formed between the multiple micro lenses 61 are defined with distance between the lens center and the lens edge portion in the depth direction z.

With the above, the depths Dx and Dy of the grooves formed between the micro lenses 61 arrayed in the horizontal direction x are suitably 150 nm or less.

In the case of other than this range, focusing to the photodiode 21 is performed with a high angle, and accordingly, inconvenience of deterioration in smear may occur.

Also, with the above, relationship between the depth Dk of the groove formed between the micro lenses 61 arrayed in the diagonal direction k, and the depth Dx of the groove formed between the micro lenses 61 arrayed in the horizontal direction x suitably satisfies the following Expression (1).

In the event that the Dk is triple or less as to the Dx, sufficient sensitivity is not obtained due to insufficient curvature, and in the event that the Dk is five times or more, the curvature is too high, and smear may deteriorate.

$$Dx:Dk=1:3 \text{ to } 5 \tag{1}$$

In this way, with the present embodiment, the micro lenses 61 are formed so as to configure an aspherical lens.

B. Manufacturing Method

The manufacturing method for manufacturing the above solid-state imaging device 1 will be described.

Figure 7:
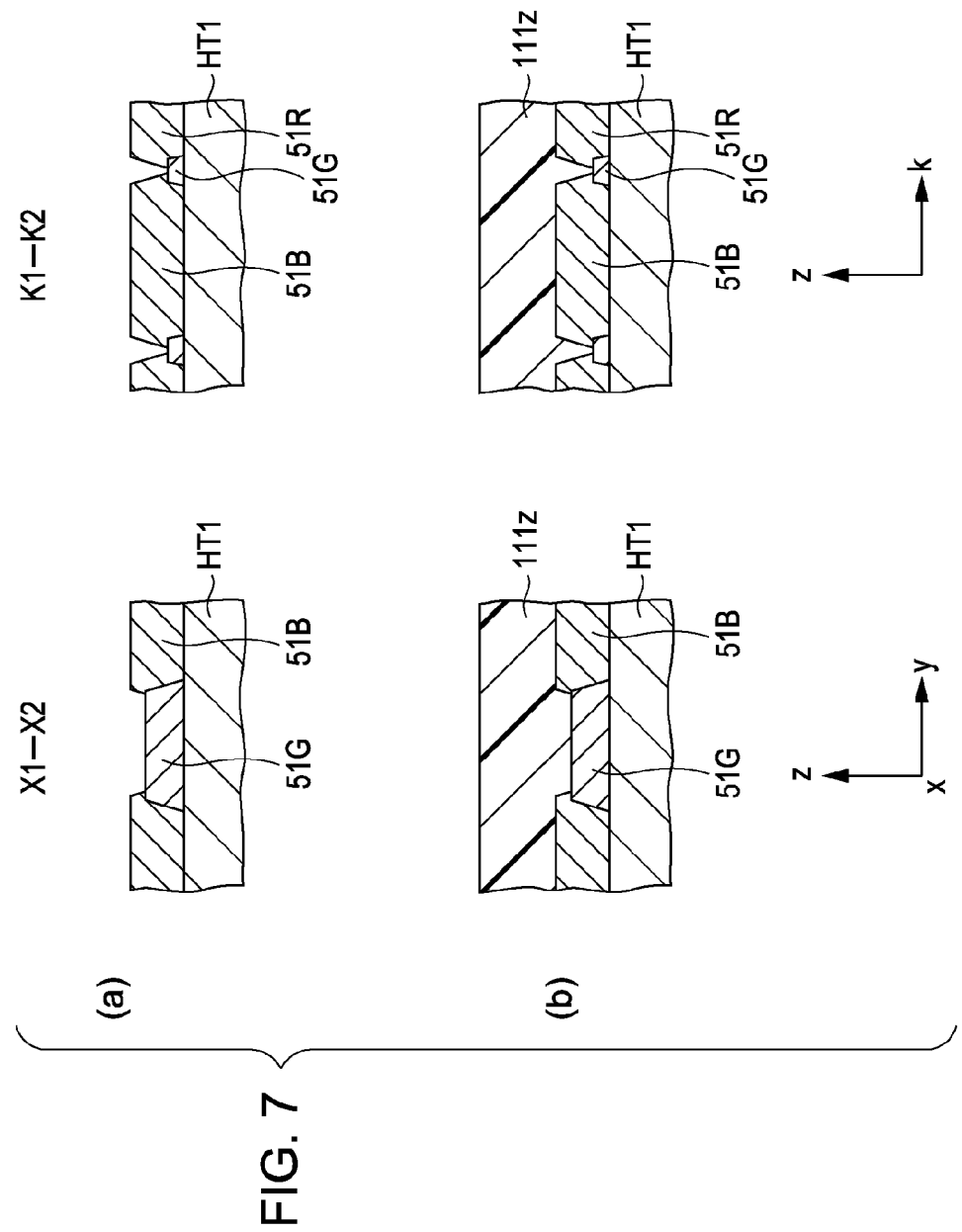
FIG. 7 is a diagram illustrating the principal portions provided at each process of the manufacturing method of the solid-state imaging device according to the first embodiment of the present invention.
Figure 8:
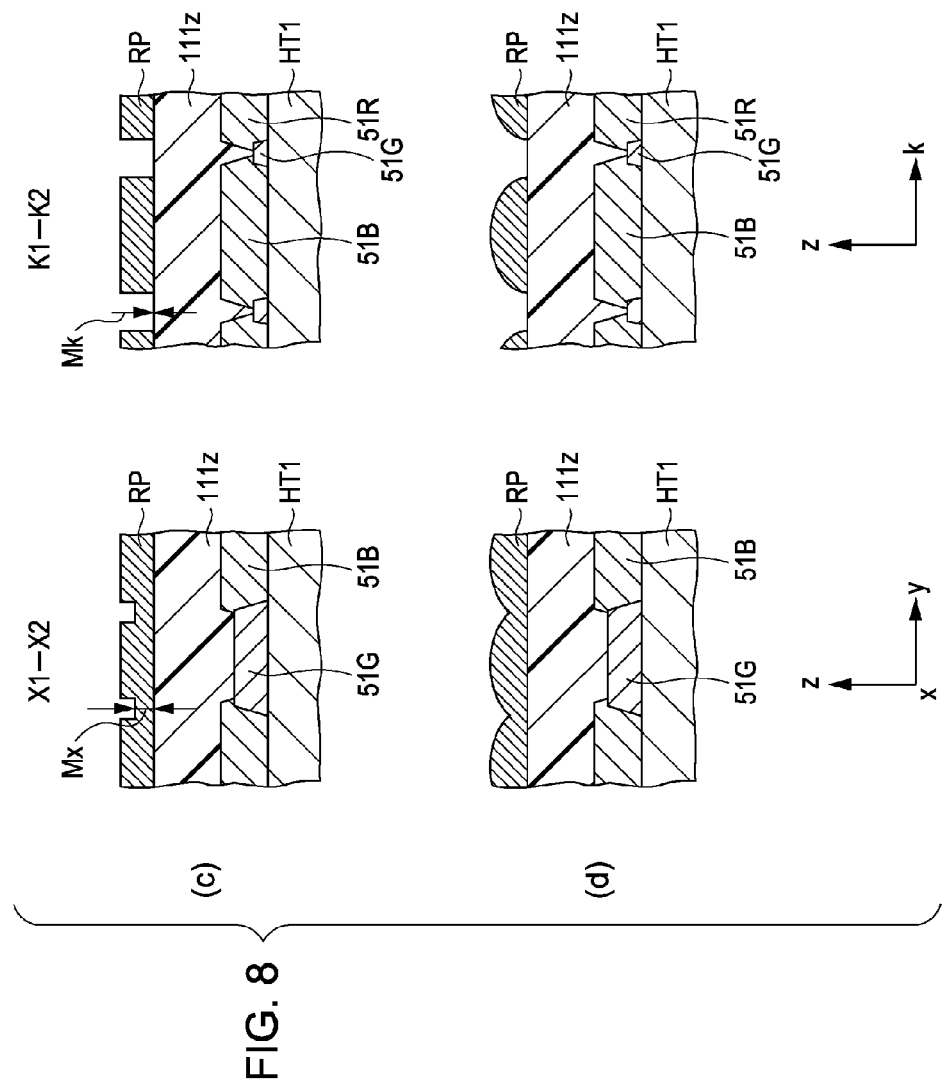
FIG. 8 is a diagram illustrating the principal portions provided at each process of the manufacturing method of the solid-state imaging device according to the first embodiment of the present invention.

FIGS. 7 and 8 are diagrams illustrating principal portions provided at each process of the manufacturing method of the solid-state imaging device 1 according to the first embodiment of the present invention. In FIGS. 7 and 8, each process of the manufacturing method of the solid-state imaging device 1 is illustrated in the sequence of (a), (b), (c), and (d). In FIGS. 7 and 8, the left side portion illustrates, in the same way as with FIG. 3, a cross-section (X1-X2 portion) in the horizontal direction x illustrated in FIG. 6. Also, in FIGS. 7 and 8, the right side portion illustrates, in the same way as with FIG. 5B, a cross-section (K1-K2 portion) in the diagonal direction k illustrated in FIG. 6. The cross-section (Y1-Y2 portion) in the vertical direction y illustrated in FIG. 6 is the same as the left side portion in FIGS. 7 and 8, and accordingly, description thereof will be omitted.

(1) Formation of the Color Filter 51

First, such as illustrated in (a) in FIG. 7, the color filter 51 is formed. Here, before formation of the color filter 51, such as illustrated in FIG. 3, the photodiodes 21, charge readout channel regions 22R, charge transfer channel regions 23T, and channel stopper regions 24C are provided to the substrate 101. Subsequently, after the transfer electrodes 31, metal light-shielding films 41, and intra-layer lenses 45 are each formed on the surface of the substrate 101, a flattening film HT1 is formed. Subsequently, the color filter 51 is formed on the upper surface of the flattening film HT1.

Specifically, such as illustrated in FIG. 4, each of the green filter layer 51G, red filter layer 51R, and blue filter layer 51B are provided in a manner arrayed with a Bayer array.

For example, coating liquid containing pigment according to each color, a dispersion resin, a photopolymerization initiator, a multifunctional photopolymerization compound, a solvent, and other additives is applied on the flattening film HT1, and is dried. Subsequently, the applied film is subjected to pattern processing by the lithography technology, thereby sequentially performing formation of each of the layers 51R, 51G, and 51B.

(2) Formation of the Lens Material Layer 111z

Next, such as illustrated in (b) in FIG. 7, formation of a lens material layer 111z will be performed. Here, a polystyrene resin is provided on the upper surface of the color filter 51 as a lens material layer 111z. For example, this lens material layer 111z is formed by the spin coat method so that the film thickness becomes 400 μm.

The lens material layer 111z may be formed using various types of materials, besides a polystyrene resin. For example, the lens material layer 111z may be formed using a material such as an acrylic resin, polyimide resin, epoxy resin, copolymerization resin, or the like.

(3) Formation of the Resist Pattern RP

Next, formation of the resist pattern RP will be performed such as illustrated in (c) in FIG. 8. Here, after coating liquid containing an i-line positive type photosensitive resin such as a novolak resin or the like is applied on the upper surface of the lens material layer 111z, the coating liquid is dried, thereby providing a photoresist film (not illustrated). Subsequently, this photoresist film is subjected to pattern processing using photolithography technology, thereby forming a resist pattern RP on the upper surface of the lens material layer 111z. That is to say, after exposure processing is carried out wherein the mask pattern image of a photo mask (not illustrated) is transferred to the photoresist film, the photoresist film subjected to the exposure processing is subjected to development, thereby forming a resist pattern RP. Thus, the resist pattern RP protruding at the upper surface of the lens material layer 111z is formed.

Specifically, such as illustrated in (c) in FIG. 8, the resist pattern RP is formed so that the center portion of a region where the micro lenses 61 illustrated in FIGS. 3, 5A, and 5B are formed has film thickness thicker than around the center portion thereof.

With the present embodiment, such as illustrated on the left and right sides in (c) in FIG. 8, the resist pattern RP is formed so that the thickness around the center portion of the region where the micro lens 61 (see FIGS. 3, 5A, and 5B) is formed differs between the horizontal direction x and the diagonal direction k. Here, the resist pattern RP is formed so that film thickness Mx in the horizontal direction x is thicker than thickness Mk in the diagonal direction k.

For example, with the circumference of the center portion of the region where the micro lenses 61 (see FIGS. 3, 5A, and 5B) are formed, the film thickness Mk in the diagonal direction k (the right side portion in (c) in FIG. 8) is 0, and the thickness Mx in the horizontal direction x is thicker than the film thickness Mk. In (c) in FIG. 8, though not illustrated in the drawing, formation of the resist pattern RP is also performed so that film thickness My in the vertical direction y becomes the same thickness as the film thickness Mx in the horizontal direction x (i.e., Mx=My).

FIG. 9 is a diagram illustrating a photo mask to be used for the formation process of the resist pattern RP according to the first embodiment of the present invention. FIG. 9 illustrates the upper surface thereof.

As illustrated in FIG. 9, with a portion where the resist pattern RP is formed while remaining the photoresist film, a photo mask PM is employed wherein a light-shielding portion SK for shielding exposing light in the exposure processing is provided as a mask pattern.

On the other hand, such as illustrated in FIG. 9, with regard to a boundary portion between the micro lenses 61 (see FIG. 6) arrayed in the horizontal direction x and the vertical direction y, in order to remain a part of the photoresist film, a semi-transmissive portion FT of a halftone mask is provided. Also, such as illustrated in FIG. 9, with regard to a portion between the micro lenses 61 (see FIG. 6) formed arrayed in the diagonal direction k, in order to remove the whole portion of the photoresist film, a transmissive portion TT is provided.

After the exposure processing is carried out regarding the photoresist film using the above photo mask PM, the development is performed, thereby forming the resist pattern RP so that the film thicknesses Mx and My in the horizontal direction x and the vertical direction y are thicker than the film thickness Mk in the diagonal direction k.

For example, formation of the resist pattern RP is carried out in accordance with the following conditions.

Resist Pattern RP Forming Conditions
  Photoresist material: i-line positive type resist
  Photoresist film thickness: 400 nm
  Prebaking conditions: 80° C. 90 sec. (on a hot plate)
  Exposure conditions: ¼ reduction exposure device (NA 0.5, σ 0.7)
  Baking conditions after exposure: none
  Developing conditions: developer TMAH 2.38%, developing time 60 sec×2 puddle development Note that description has been made above regarding a case where exposure processing is carried out using a halftone mask, but the present embodiment is not restricted to this. For example, under exposing (0.3 μm or more) may be allowed using a photo mask wherein a linewidth pattern of an i-line resolution level is formed. Also, the above exposure processing may be carried out using a photo mask wherein a linewidth pattern equal to or smaller than i-line resolution is formed.

(4) Resist Pattern RP is Processed into a Lens Shape

Next, the resist pattern RP is processed into a lens shape such as illustrated in (d) in FIG. 8. Here, the resist pattern RP thus formed is subjected to a heating reflow process, thereby processing the resist pattern RP into a lens shape.

In a heating reflow process step according to the present embodiment, the heating reflow process is carried out so that the resist patterns arrayed adjacent to the diagonal direction k on the imaging face hold a state separated between the resist patterns, and also the resist patterns arrayed in the horizontal direction x are mutually fused.

Specifically, for example, post bake processing is carried out twice as the heating reflow process. For example, the heating reflow process is carried out so that the temperature condition of the second post bake processing to be carried out second time is higher than the temperature condition of the first post bake processing to be carried out first time.

For example, the present process is carried out under the following reflow process conditions.
  First post bake processing conditions: 140 through 150° C., 120 sec. (on a hot plate)
  Second post bake processing conditions: 170 through 180° C., 120 sec. (on a hot plate)

Thus, such as illustrated in (d) in FIG. 8, the surface becomes a curved surface, and the resist pattern RP is processed into a lens shape.

With the present embodiment, such as illustrated in the left side portion in (d) in FIG. 8, a boundary portion between the micro lenses 61 (see FIGS. 3, 5A, and 5B) arrayed in the horizontal direction x is formed so that the lens-shaped resist patterns RP are formed so as to be mutually fused. Though not illustrated in the drawing, even with the boundary line portion between the micro lenses 61 arrayed in the vertical direction y, the lens-shaped resist patterns RP are formed so as to be mutually fused. That is to say, with this portion, the lens-shaped resist patterns RP are formed so that the lens based material film 111z is covered.

On the other hand, such as illustrated in the right side portion in (d) in FIG. 8, a portion between the micro lenses 61 (see FIGS. 3, 5A, and 5B) arrayed in the diagonal direction k is formed so that the lens-shaped resist patterns RP are formed in a state separated between the resist patterns. That is to say, with this portion, the lens-shaped resist patterns RP are formed so that the surface of the lens material layer 111z is exposed.

Therefore, such as illustrated in FIG. 8, the lens-shaped resist patterns RP are formed so that the film thickness of a portion between the multiple micro lenses 61 is thicker in the diagonal direction k than in the horizontal direction x and the vertical direction y. Further, the lens-shaped resist patterns RP are fused in the horizontal direction x and the vertical direction y, and accordingly, the lens-shaped resist patterns RP are formed so that the curvature is lower in the diagonal direction k than the horizontal direction x and the vertical direction y. That is to say, the resist patterns RP are formed in a lens shape so as to correspond to the curvature of the lens surface of the micro lens 61 to be formed.

(5) Formation of the Micro Lens 61

Next, formation of the micro lens 61 is performed such as illustrated in FIGS. 3, 5A, 5B, and 6. Here, the lens-shaped resist pattern RP is employed as a mask, and the whole surface of the lens material layer 111z is subjected to an etchback process. That is to say, the lens material layer 111z is processed into micro lenses 61 so that the lens-shaped pattern of the resist pattern RP is transferred to the lens material layer 111z.

Thus, the resist pattern RP and the lens material layer 111z are removed, and the lens material layer 111z is pattern-processed into micro lenses 61 such as illustrated in FIGS. 3, 5A, 5B, and 6.

With the present embodiment, such as illustrated in FIGS. 3 and 6, each of the micro lenses 61 is formed so that the micro lenses 61 arrayed adjacent to the horizontal direction x come into contact with each other at a side extending in the vertical direction y. Also, such as illustrated in FIGS. 5A and 6, each of the micro lenses 61 is formed so that the micro lenses 61 arrayed adjacent to the vertical direction y come into contact with each other at a side extending in the horizontal direction x. Further, each of the micro lenses 61 is formed so that the lens surfaces of the micro lenses 61 have the same curvature at each cross-section in the horizontal direction x and the vertical direction y, and the depths Dx and Dy of grooves between the micro lenses 61 have the same depth.

Also, such as illustrated in FIGS. 3 and 5B, each of the micro lenses 61 is formed so that the micro lenses 61 arrayed adjacent to the diagonal direction k come into contact with each other at a portion where a side extending in the horizontal direction x and a side extending in the vertical direction y intersect. Subsequently, each of the micro lenses 61 is formed so that the lens surfaces of the micro lenses 61 arrayed in the diagonal direction k have higher curvature than the lens surfaces of the micro lenses 61 in the horizontal direction x and the vertical direction y. Further, each of the micro lenses 61 is formed so that the depth Dk of a groove to be formed between the micro lenses 61 arrayed in the diagonal direction k is deeper than the depths Dx and Dy of grooves to be formed between the micro lenses 61 arrayed in the horizontal direction x and the vertical direction y.

For example, the above etchback process is carried out under the following conditions to form each of the micro lenses 61.

Etching Conditions

Etchback device: magnetron RIE device
Etching gas: CF4=155 ccm
High-frequency power: 1.8 W/cm$^2$
Pressure within an etching room: 6.65 Pa
Lower electrode temperature (chiller temperature): 0° C.
Etching amount: 2.4 µm (converted into terms of stainless steel resist)

Thus, each of the micro lenses 61 is formed so that the depth Dx of a groove to be formed between the micro lenses 61 arrayed in the horizontal direction x is equal to or less than 150 nm. Also, each of the micro lenses 61 is formed so that relationship between the depth Dk of a groove to be formed between the micro lenses 61 arrayed in the diagonal direction k, and the depth Dx of a groove to be formed between the micro lenses 61 arrayed in the horizontal direction x satisfies the above Expression (1). That is to say, each of the micro lenses 61 is formed as an aspherical lens.

Note that various types of etchback device other than a magnetron RIE device may be employed as an etchback device. For example, the following etchback devices may be employed.

Parallel plate type RIE device
High-pressure narrow gap type plasma etching device
ECR type etching device
Microwave plasma type etching device
Transformer-coupling plasma type etching device
Inductively-coupled-plasma type etching device
Helicon-wave-plasma type etching device C. Conclusion As described above, with the present embodiment, the micro lenses 61 of which the planar shape of the imaging face has a shape including a portion divided by a side extending in the horizontal direction x, and a side extending in the vertical direction y. The multiple micro lenses 61 are disposed so as to be arrayed adjacent to each other in each of the horizontal direction x and the vertical direction y. Also, the multiple micro lenses 61 are formed so that the depth of a groove between the micro lenses 61 arrayed in the diagonal direction k inclined as to the horizontal direction x and the vertical direction y of the image surface is deeper than the depth of a groove between the micro lenses 61 arrayed in the horizontal direction x. Further, the multiple micro lenses are also formed so that the curvature of the lens surface in the diagonal direction k is higher than the curvature of the lens surface in the horizontal direction x.

Also, the multiple micro lenses 61 are formed so that depth D1 of a groove between the micro lenses 61 arrayed in the horizontal direction x, and depth D3 of a groove between the micro lenses arrayed in the diagonal direction k have a relation of D1:D3=1:3 to 5.

Also, the multiple micro lenses 61 are formed so that depth D1 of a groove between the micro lenses 61 arrayed in the horizontal direction x has a relation of D1≤150 nm.

As described above, in the event that the curvature of the micro lenses 61 is high (in the event that the lens layer thickness is thick), the sensitivity thereof is generally improved. CCD-type solid-state imaging devices have features wherein the sensor shape is a square shape such as a square, rectangle, or the like, and accordingly, smear readily occurs in the horizontal direction x, but smear is prevented from occurring in the diagonal direction k.

With the present embodiment, the micro lenses 61 have features wherein the curvature in the diagonal direction k is higher than the curvature in the horizontal direction x, and accordingly, incident light from the diagonal direction k where smear is prevented from occurring can effectively be focused onto the light-receiving surface. That is to say, the curvature of the micro lenses 61 is low in the horizontal direction x (lens thickness is thin), and accordingly, input of light to the vertical transfer unit serving as a cause for occurrence of smear can be prevented. Also, the curvature of the micro lenses 61 is high in the diagonal direction k (lens thickness is thick), the sensitivity can be improved. Thus, the present embodiment can effectively realize both of improvement in sensitivity, and prevention of occurrence of smear.

Specifically, with the solid-state imaging device according to the present embodiment, it has been confirmed that the sensitivity improves 4%, and also the smear improves 0.4 dB as to the configuration according to the related art.

Accordingly, with the present embodiment, the micro lenses 61 are formed with high precision, whereby focusing efficiency can be improved, and the image quality of an imaged image can readily be improved.

2. Second Embodiment

A. Device Configuration, Etc.

Figure 10:
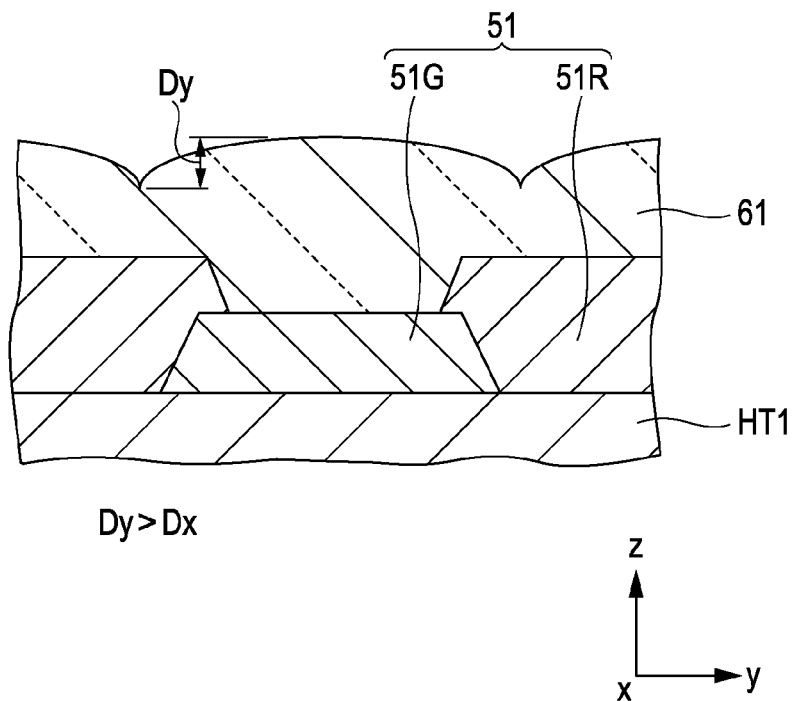
FIG. 10 is a diagram illustrating the principal portions of a solid-state imaging device according to a second embodiment of the present invention.

FIG. 10 is a diagram illustrating the principal portions of a solid-state imaging device according to a second embodiment of the present invention. Here, FIG. 10 illustrates a portion where the micro lenses 61 are formed, and illustrates a cross-section (Y1-Y2 portion) in the vertical direction y, in the same way as FIG. 5A.

As illustrated in FIG. 10, with the present embodiment, the micro lenses 61 differ from those according to the first embodiment. Except for this and related points, the present embodiment is the same as the first embodiment, so description of redundant portions will be omitted.

With the first embodiment, each of the micro lenses 61 is formed so that the curvature of the lens surface is the same at the cross-section in each of the horizontal direction x and the vertical direction y. Also, each of the micro lenses 61 is formed so that the depths Dx and Dy of grooves to be formed between the micro lenses 61 are the same at the cross-section in each of the horizontal direction x and the vertical direction y.

However, with the present embodiment, such as illustrated in FIG. 10, each of the micro lenses 61 is formed so that the curvature of the lens surface at the cross-section in each of the horizontal direction x and the vertical direction y mutually differs. Also, each of the micro lenses 61 is formed so that the depth Dx and Dy of grooves to be formed between the micro lenses 61 mutually differ at the cross-section in each of the horizontal direction x and the vertical direction y.

Specifically, each of the micro lenses 61 is formed so that the curvature of the lens surface on a cross-section in the vertical direction y is higher than the curvature of the lens surface at the cross-section in the horizontal direction x. Also, each of the micro lenses 61 is formed so that the depth Dy of a groove between the micro lenses 61 at the cross-section in the vertical direction y is deeper than the depth Dx of a groove between the micro lenses 61 at the cross-section in the horizontal direction x.

Note that each of the micro lenses 61 is formed in the same way as with the first embodiment regarding the cross-section in the diagonal direction k.

B. Manufacturing Method

Description will be made regarding the manufacturing method for manufacturing the solid-state imaging device according to the present embodiment.

Figure 11:
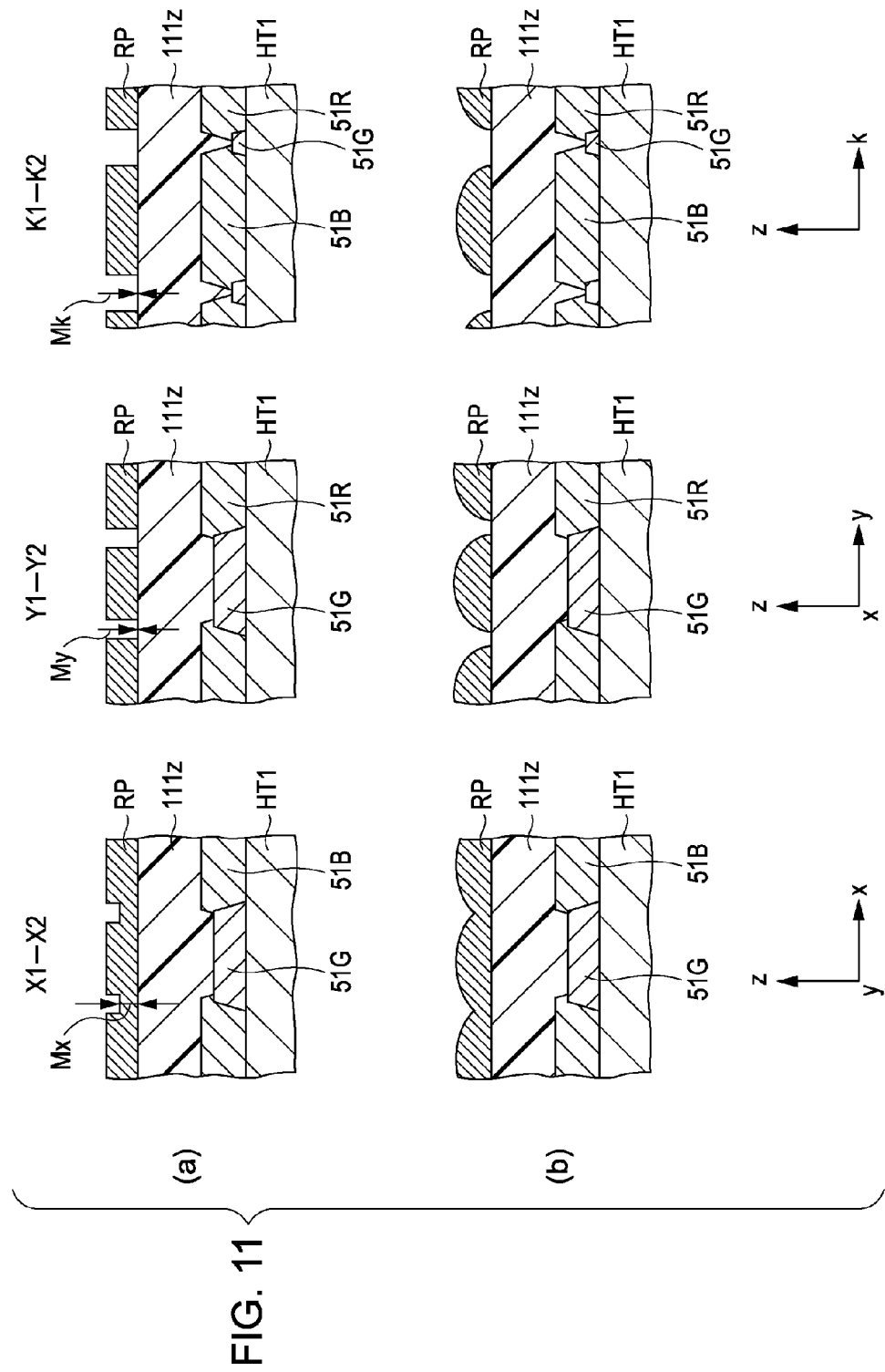
FIG. 11 is a diagram illustrating the principal portions provided at each process of the manufacturing method of the solid-state imaging device according to the second embodiment of the present invention.

FIG. 11 is a diagram illustrating principal portions to be provided at each process of the manufacturing method of the solid-state imaging device according to the second embodiment of the present invention. FIG. 11 illustrates each process of the manufacturing method of the solid-state imaging device in the sequence of (a) and (b). In FIG. 11, the left side portion illustrates, in the same way as FIG. 3, the cross-section (X1-X2 portion) in the horizontal direction x illustrated in FIG. 6. Also, in FIG. 11, the right side portion illustrates, in the same way as FIG. 5B, the cross-section (K1-K2 portion) in the diagonal direction k illustrated in FIG. 6. Further, in FIG. 11, the central portion illustrates, in the same way as FIG. 10, the cross-section (Y1-Y2 portion) in the vertical direction y illustrated in FIG. 6.

(1) Formation of the Resist Pattern RP

First, such as illustrated in (a) in FIG. 11, formation of the resist pattern RP is performed. Here, before formation of the resist pattern RP, in the same way as with the first embodiment, formation of the color filter 51, and formation of the lens material layer 111z are carried out in this order.

Subsequently, in the same way as with the first embodiment, after a photoresist film (not illustrated) is provided to the upper face of the lens material layer 111z, processing for subjecting the photoresist film thereof to pattern processing is carried out to generate the resist pattern RP.

With the present embodiment, such as illustrated on the left side and the right side in (a) in FIG. 11, the resist pattern RP is formed regarding each cross-section in the horizontal direction x and the diagonal direction k in the same way as with the first embodiment.

However, such as illustrated in the central portion in (a) in FIG. 11, the resist pattern RP is formed regarding the cross-section in the vertical direction y so as to be different from the first embodiment.

Specifically, such as illustrated in (a) in FIG. 11, the resist pattern RP is formed so that the film thickness around the center portion of a region where the micro lenses 61 (see FIGS. 3, 5A, and 5B) are formed mutually differs between the horizontal direction x and the vertical direction y. Here, formation is performed so that the film thickness My in the vertical direction y is thinner than the film thickness Mx in the horizontal direction x.

For example, in the same way as the cross-section in the diagonal direction k, the resist pattern RP is formed so that the surface of the lens material layer 111z is exposed at the boundary portion of a portion where the micro lenses 61 (see FIGS. 3, 5A, and 5B).

FIG. 12 is a diagram illustrating a photo mask to be used for the formation process of the resist pattern RP according to the second embodiment of the present invention. FIG. 12 illustrates the upper surface thereof. As illustrated in FIG. 12, in the same way as with the first embodiment, a light-shielding portion SK for shielding exposing light is provided to a portion where the resist pattern RP is formed while remaining a photoresist film, as a mask pattern. Also, with regard to a boundary portion between the micro lenses 61 (see FIG. 6) arrayed in the horizontal direction x, in order to remain a part of the photoresist film, a semi-transmissive portion FT of a halftone mask is provided.

However, with the present embodiment, unlike the first embodiment, with regard to a portion between the micro lenses 61 (see FIG. 6) arrayed in the vertical direction y and the diagonal direction k, in order to remove the whole of the photoresist film, a photo mask PM to which a transmissive portion TT is provided is employed.

Subsequently, after the photoresist film is subjected to the exposure processing using the above photo mask PM, development is carried out, and accordingly, the above resist pattern RP is formed.

Note that description has been made above regarding a case where the exposure processing is carried out using the halftone mask, but the present embodiment is not restricted to this. In the same way as with the first embodiment, for example, under exposing (0.3 μm or more) may be allowed using a photo mask wherein a linewidth pattern of an i-line resolution level is formed. Also, the above exposure processing may be carried out using a photo mask wherein a linewidth pattern equal to or smaller than i-line resolution is formed.

(2) Resist Pattern RP is Processed into a Lens Shape

Next, the resist pattern RP is processed into a lens shape such as illustrated in (b) in FIG. 11. Here, in the same way as with the first embodiment, the resist pattern RP thus formed is subjected to the heating reflow process, thereby processing the resist pattern RP into a lens shape.

With the present embodiment, such as illustrated in the left side portion in (b) in FIG. 11, a boundary portion between the micro lenses 61 (see FIGS. 3, 5A, and 5B) arrayed in the horizontal direction x is formed so that the lens-shaped resist patterns RP are mutually fused in the same way as with the first embodiment. That is to say, the lens-shaped resist patterns RP are formed so as to cover the lens material layer 111z at this portion.

Also, such as illustrated in the right side portion in (b) in FIG. 11, with a portion between the micro lenses 61 (see FIGS. 3, 5A, and 5B) arrayed in the diagonal direction k, in the same way as the first embodiment, the lens-shaped resist patterns RP are formed so as to be separated therebetween. That is to say, the lens-shaped resist patterns RP are formed so that the surface of the lens material layer 111z is exposed at this portion.

On the other hand, such as illustrated in the central portion in (b) in FIG. 11, with a boundary portion between the micro lenses 61 (see FIG. 10) arrayed in the vertical direction y, unlike the first embodiment, the lens-shaped resist patterns RP are formed so as to be separated therebetween. That is to say, with this portion, the lens-shaped resist patterns RP are formed so that the surface of the lens material layer 111z is exposed.

Therefore, such as illustrated in FIG. 11, the lens-shaped resist patterns RP are formed so that the film thickness of a portion between the multiple micro lenses 61 is thicker in the vertical direction y and the diagonal direction k than in the horizontal direction x. Further, the lens-shaped resist patterns RP are fused in the horizontal direction x, and accordingly, each of the lens-shaped resist patterns RP is formed so that the curvature is lower in the vertical direction y and the diagonal direction k than the horizontal direction x. That is to say, the resist pattern RP is formed in a lens shape so as to correspond to the curvature of the lens surface of the micro lens 61 to be formed.

(3) Formation of the Micro Lens 61

Next, formation of the micro lens 61 is performed such as illustrated in FIGS. 3, 5B, and 10. Here, in the same way as with the first embodiment, the lens-shaped resist pattern RP is employed as a mask, and the whole surface of the lens material layer 111z is subjected to the etchback process. That is to say, the lens material layer 111z is processed into micro lenses 61 so that the lens-shaped pattern of the resist pattern RP is transferred to the lens material layer 111z.

With the present embodiment, unlike the first embodiment, each of the micro lenses 61 is formed so that the curvature of the lens surface at the cross-section in the vertical direction y is higher than the curvature of the lens surface at the cross-section in the horizontal direction x. Also, each of the micro lenses 61 is formed so that the depth Dy of a groove between the micro lenses 61 at the cross-section in the vertical direction y is deeper than the depth Dx of a groove between the micro lenses 61 at the cross-section in the horizontal direction x.

C. Conclusion

As described above, with the present embodiment, in the same way as the first embodiment, the multiple micro lenses 61 are formed so that the depth of a groove between the micro lenses 61 arrayed in the diagonal direction k of the image surface is deeper than the depth of a groove between the micro lenses 61 arrayed in the horizontal direction x. Also, the multiple micro lenses 61 are formed so that the curvature of the lens surface in the diagonal direction k is higher than the curvature of the lens surface in the horizontal direction x.

With the present embodiment, with the micro lenses 61, in the same way as with the first embodiment, the curvature of the micro lenses 61 is low in the horizontal direction x (lens thickness is thin), whereby input of light to the vertical transfer unit serving as a cause of occurrence of smear can be prevented.

Also, with the present embodiment, the multiple micro lenses 61 are formed so that the depth of a groove between the micro lenses 61 arrayed in the vertical direction y is deeper than the depth of a groove between the micro lenses 61 arrayed in the horizontal direction x. Further, the multiple micro lenses 61 are formed so that the curvature of the lens surface in the vertical direction y is higher than the curvature of the lens surface in the horizontal direction x. Thus, with the present embodiment, the curvature of the micro lenses 61 is higher (lens thickness is thicker) in the vertical direction y than the horizontal direction x in the same way as with the diagonal direction k, and accordingly, the sensitivity can further be improved. Therefore, the present embodiment can effectively realize both of improvement in sensitivity, and prevention of occurrence of smear.

Accordingly, with the present embodiment, the micro lenses 61 are formed with high precision, whereby focusing efficiency can be improved, and the image quality of an imaged image can readily be improved.

3. Third Embodiment

A. Device Configuration, Etc.

Figure 13A:
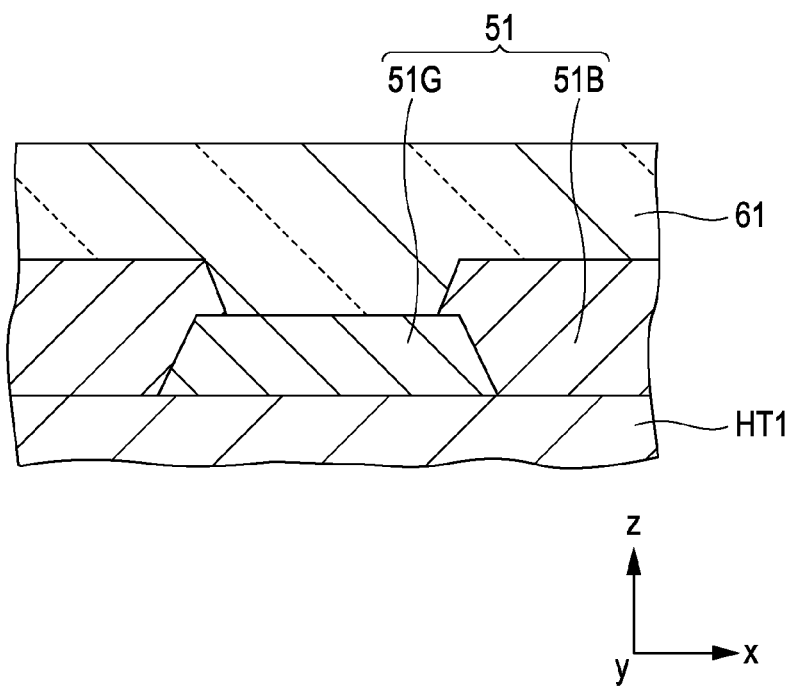
FIGS. 13A and 13B are diagrams illustrating the principal portions of a solid-state imaging device according to a third embodiment of the present invention.
Figure 13B:
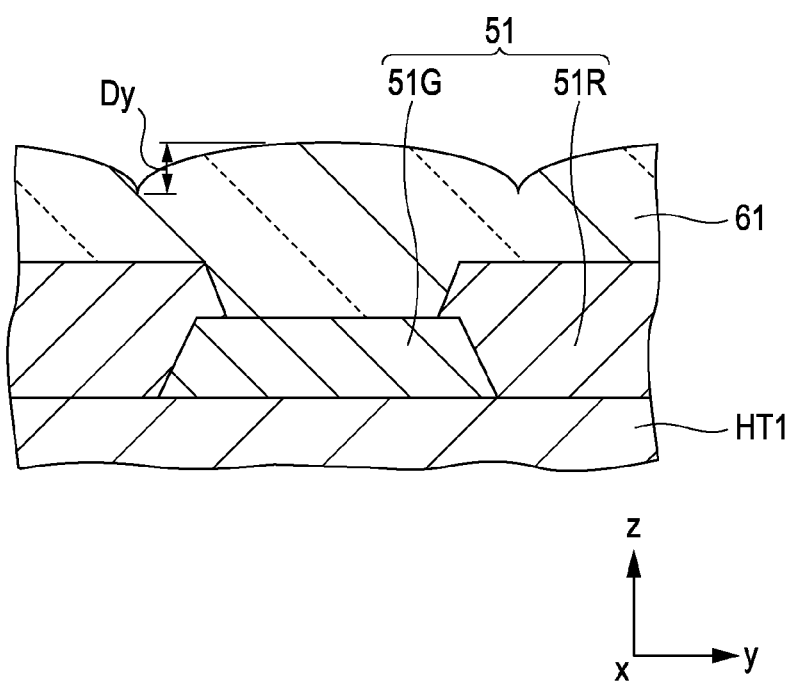

FIGS. 13A and 13B are diagrams illustrating the principal portions of a solid-state imaging device according to a third embodiment of the present invention. Here, FIGS. 13A and 13B illustrate a portion where the micro lenses 61 are formed, where FIG. 13A illustrates a cross-section (X1-X2 portion) in the horizontal direction x, and FIG. 13B illustrates a cross-section (Y1-Y2 portion) in the vertical direction y.

As illustrated in FIGS. 13A and 13B, with the present embodiment, the micro lenses 61 differ from those according to the first embodiment. Other than this and related points, the present embodiment is the same as the first embodiment, so description of redundant portions will be omitted.

As illustrated in FIG. 13A, at the cross-section in the horizontal direction x, the micro lenses 61 are provided so that the upper surface portion is along the horizontal direction x.

On the other hand, at the cross-section in the vertical direction y, the micro lenses 61 are configured as a convex lens wherein the upper surface portion is a curved surface, and the center is formed so as to be thicker than the edge.

That is to say, with the present embodiment, the micro lenses 61 are formed so that the cross-section in the vertical direction y has a lens shape, and the cross-section in the horizontal direction x has a dome-like shape extending linearly.

B. Manufacturing Method

Description will be made regarding the manufacturing method for manufacturing the solid-state imaging device according to the present embodiment.

Figure 14:
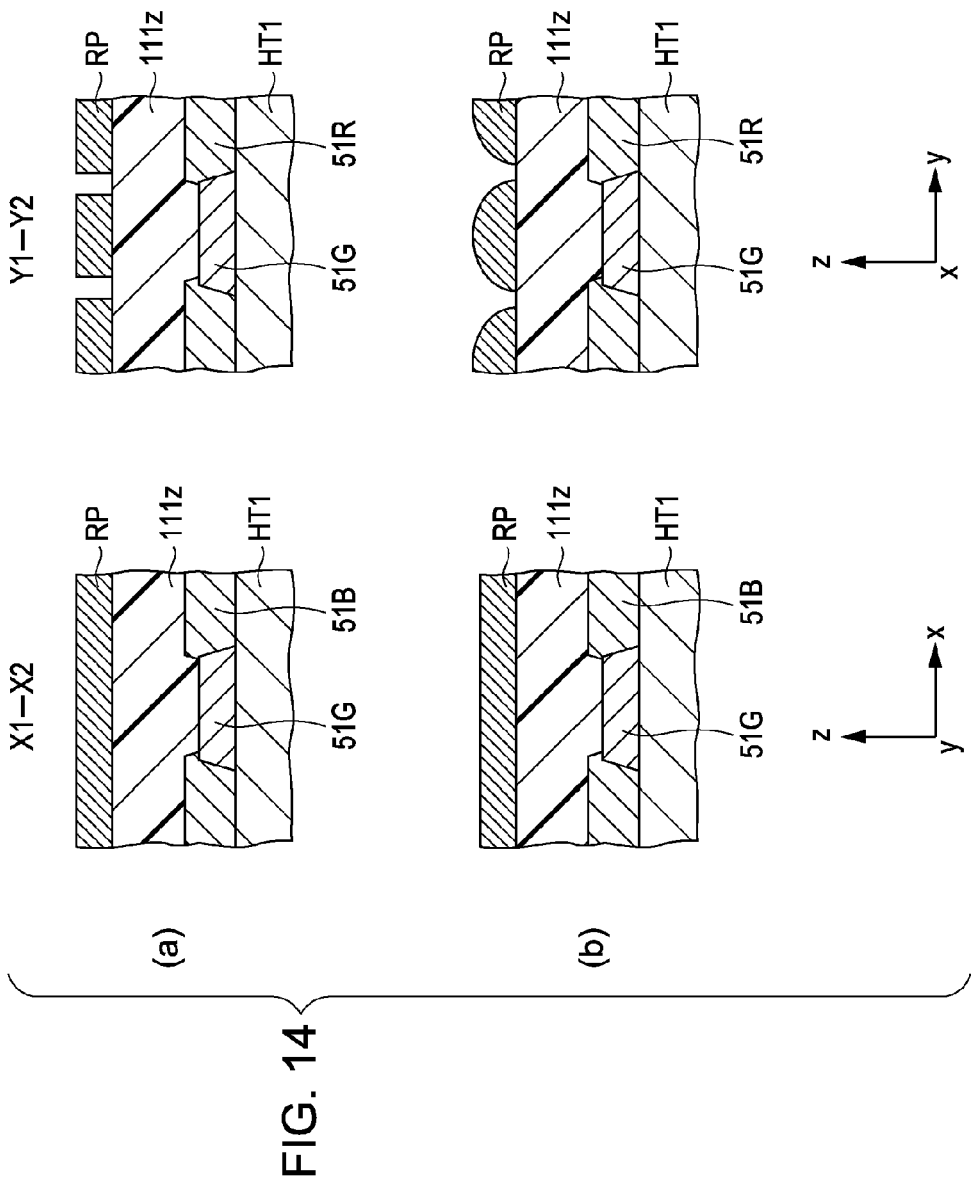
FIG. 14 is a diagram illustrating the principal portions provided at each process of the manufacturing method of the solid-state imaging device according to the third embodiment of the present invention.

FIG. 14 is a diagram illustrating principal portions to be provided at each process of the manufacturing method of the solid-state imaging device according to the third embodiment of the present invention. FIG. 14 illustrates each process of the manufacturing method of the solid-state imaging device in the sequence of (a) and (b). In FIG. 14, the left side portion illustrates, in the same way as FIG. 13A, the cross-section (X1-X2 portion) in the horizontal direction x. Also, in FIG. 14, the right side portion illustrates, in the same way as FIG. 13B, the cross-section (Y1-Y2 portion) in the vertical direction y.

(1) Formation of the Resist Pattern RP

First, such as illustrated in (a) in FIG. 14, formation of the resist pattern RP will be performed. Here, before formation of the resist pattern RP, in the same way as with the first embodiment, formation of the color filter 51, and formation of the lens material layer 111z are carried out in this order.

Subsequently, in the same way as with the first embodiment, after a photoresist film (not illustrated) is provided to the upper face of the lens material layer 111z, processing for subjecting the photoresist film thereof to pattern processing is carried out to generate the resist pattern RP. Specifically, after exposure processing is carried out wherein a pattern image is exposed to the photoresist film, development is carried out, thereby forming the resist pattern RP.

With the present embodiment, such as illustrated on the left side in (a) in FIG. 14, with regard to the cross-section in the horizontal direction x, the resist pattern RP is formed so that a state flatly extending to the horizontal direction x is maintained without providing an opening portion.

On the other hand, such as illustrated on the right side in (a) in FIG. 14, with regard to the cross-section in the vertical direction y, the resist pattern RP is formed so that a portion between the micro lenses 61 being formed is opened. That is to say, with regard to this portion, the resist pattern RP is formed so that the surface of the lens material layer 111z is exposed.

(2) Resist Pattern RP is Processed into a Lens Shape

Next, the resist pattern RP is processed into a lens shape such as illustrated in (b) in FIG. 14. Here, in the same way as with the first embodiment, the resist pattern RP thus formed is subjected to the heating reflow process, thereby processing the resist pattern RP into a lens shape.

With the present embodiment, such as illustrated in the left side portion in (b) in FIG. 14, with regard to the cross-section in the horizontal direction x, no opening portion is provided, and accordingly, a state flatly extending to the horizontal direction x is maintained.

On the other hand, such as illustrated on the right side in (b) in FIG. 14, with regard to the cross-section in the vertical direction y, the portion between the micro lenses 61 being formed is opened, and accordingly, the resist patterns RP are fused and processed into a lens shape.

(3) Formation of the Micro Lens 61

Next, formation of the micro lens 61 is performed such as illustrated in FIGS. 13A and 13B. Here, in the same way as with the first embodiment, the lens-shaped resist pattern RP is employed as a mask, and the whole surface of the lens material layer 111z is subjected to the etchback process. That is to say, the lens material layer 111z is processed into micro lenses 61 so that the lens-shaped pattern of the resist pattern RP is transferred to the lens material layer 111z.

With the present embodiment, unlike the first embodiment, each of the micro lenses 61 is formed so that the cross-section in the vertical direction y has a lens shape, and the cross-section in the horizontal direction x has a dome-like shape extending linearly.

C. Conclusion

As described above, with the present embodiment, the micro lenses 61 are formed so that the lens surface to which the incident light H is input is a curved surface in the vertical direction y, and is flat in the horizontal direction x. That is to say, such as described above, the lens surface is formed in a dome-like shape.

With the present embodiment, with the micro lenses 61, the upper surface is flat in the horizontal direction x, and accordingly, in the same way as with the first embodiment, the curvature of the lens surface is low, whereby input of light to the vertical transfer unit serving as a cause of occurrence of smear can be prevented. Also, in the vertical direction y, the curvature of the lens surface is high, and focusing efficiency is high, and accordingly, sensitivity can be improved. Therefore, the present embodiment can effectively realize both of improvement in sensitivity, and prevention of occurrence of smear.

Accordingly, with the present embodiment, the image quality of an imaged image can readily be improved.

4. Fourth Embodiment

A. Device Configuration, Etc.

A-1. Principal Portion Configuration of Solid-State Imaging Device

Figure 15:
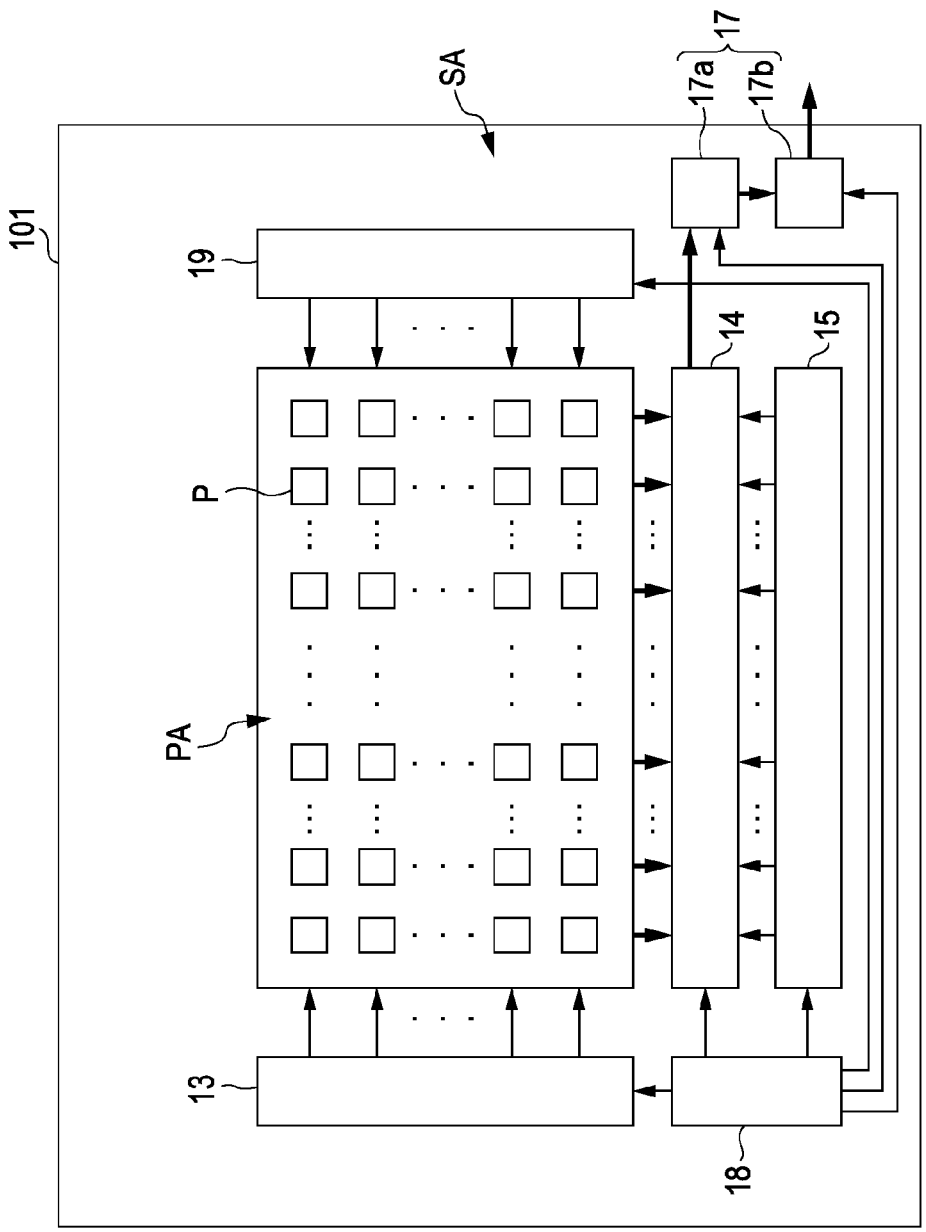
FIG. 15 is a diagram illustrating the principal portions of a solid-state imaging device according to a fourth embodiment of the present invention.

FIG. 15 is a diagram illustrating the principal portions of a solid-state imaging device according to a fourth embodiment of the present invention. The solid-state imaging device according to the present embodiment is a CMOS-type image sensor, which differs from that according to the first embodiment. Other than this and related points, the present embodiment is the same as the first embodiment, so description of redundant portions will be omitted.

As illustrated in FIG. 15, the solid-state imaging device according to the present embodiment includes a substrate 101. This substrate 101 is, for example, a semiconductor substrate made up of silicon, and an imaging region PA and a peripheral region SA are provided to the surface of the substrate 101.

The imaging region PA has, such as illustrated in FIG. 15, a rectangular shape where multiple pixels P are disposed in each of the horizontal direction x and the vertical direction y. That is to say, the pixels P are arrayed in a matrix shape. With the imaging region PA, the center thereof is disposed so as to correspond to the optical axis of the optical system 42 illustrated in FIG. 1. Note that the imaging region PA is equivalent to the imaging face PS illustrated in FIG. 1.

With the imaging region PA, the pixels P receive incident light to generate signal charge. Subsequently, the generated signal charge thereof is read out and output by a pixel transistor. The detailed configuration of the pixels P will be described later.

The peripheral region SA is, such as illustrated in FIG. 15, located around the imaging region PA. With this peripheral region SA, peripheral circuits are provided.

Specifically, such as illustrated in FIG. 15, a vertical driving circuit 13, a column circuit 14, a horizontal driving circuit 15, an external output circuit 17, a timing generator (TG) 18, and a shutter driving circuit 19 are provided as a peripheral circuit.

The vertical driving circuit 13 is, such as illustrated in FIG. 15, in the peripheral region SA, provided lateral to the imaging region PA, and is configured to select the pixels P of the imaging region PA in increments of rows to drive these.

The column circuit 14 is, such as illustrated in FIG. 15, in the peripheral region SA, provided in the lower edge portion of the imaging region PA, and carries out signal processing regarding the signal to be output from the pixels P in increments of columns. Here, the column circuit 14 includes a CDS (Correlated Double Sampling) circuit (not illustrated), and carries out signal processing for removing fixed pattern noise.

The horizontal driving circuit 15 is, such as illustrated in FIG. 15, electrically connected to the column circuit 14. The horizontal driving circuit 15 includes, for example, a shift resistor, which sequentially outputs a signal held for each column of the pixels P in the column circuit 14 to the external output circuit 17.

The external output circuit 17 is, such as illustrated in FIG. 15, electrically connected to the column circuit 14, and after the signal processing is carried out regarding the signal to be output from the column circuit 14, externally outputs this. The external output circuit 17 includes an AGC (Automatic Gain Control) circuit 17a, and an ADC circuit 17b. With the external output circuit 17, after the AGC circuit 17a applies gain to the signal, the ADC circuit 17b converts the analog signal to a digital signal, and externally outputs this.

The timing generator 18 is, such as illustrated in FIG. 15, electrically connected to each of the vertical driving circuit 13, column circuit 14, horizontal driving circuit 15, external output circuit 17, and shutter driving circuit 19. The timing generator 18 generates various types of timing signal to output this to the vertical driving circuit 13, column circuit 14, horizontal driving circuit 15, external output circuit 17, and shutter driving circuit 19, thereby performing driving control regarding each of the units.

The shutter driving circuit 19 is configured to select the pixels P in increments of rows to adjust exposure time at the pixels P.

A-2. Detailed Configuration of Solid-State Imaging Device

Figure 16:
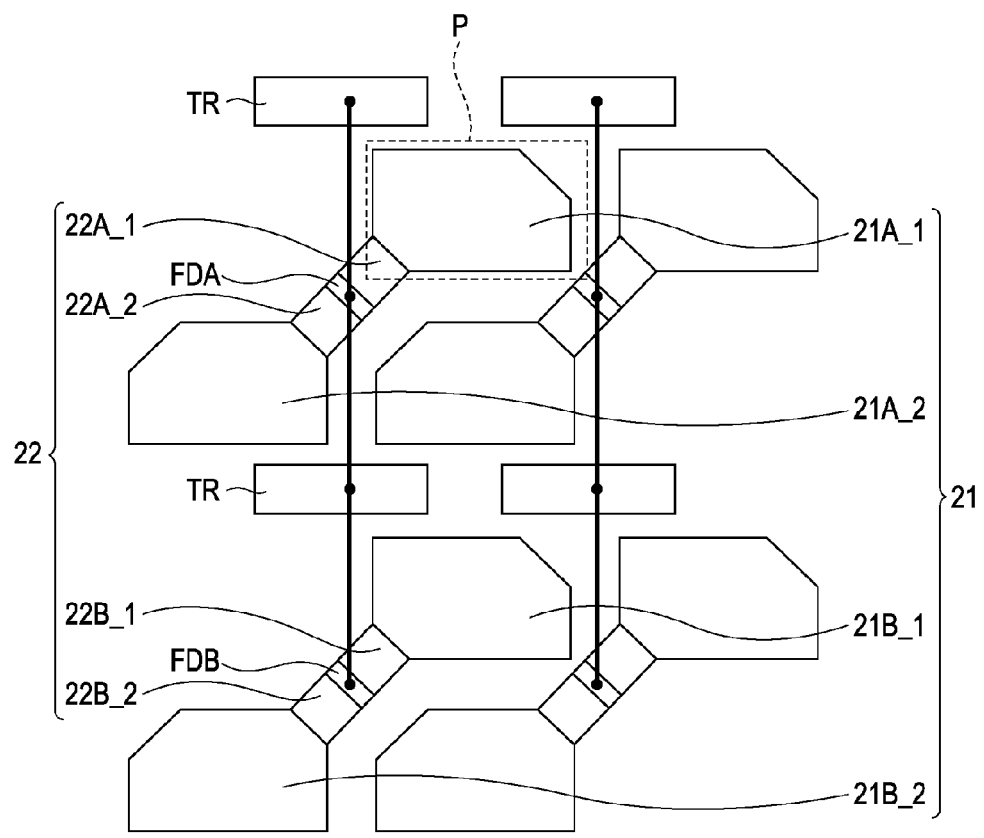
FIG. 16 is a diagram illustrating the principal portions of the solid-state imaging device according to the forth embodiment of the present invention.
Figure 17:
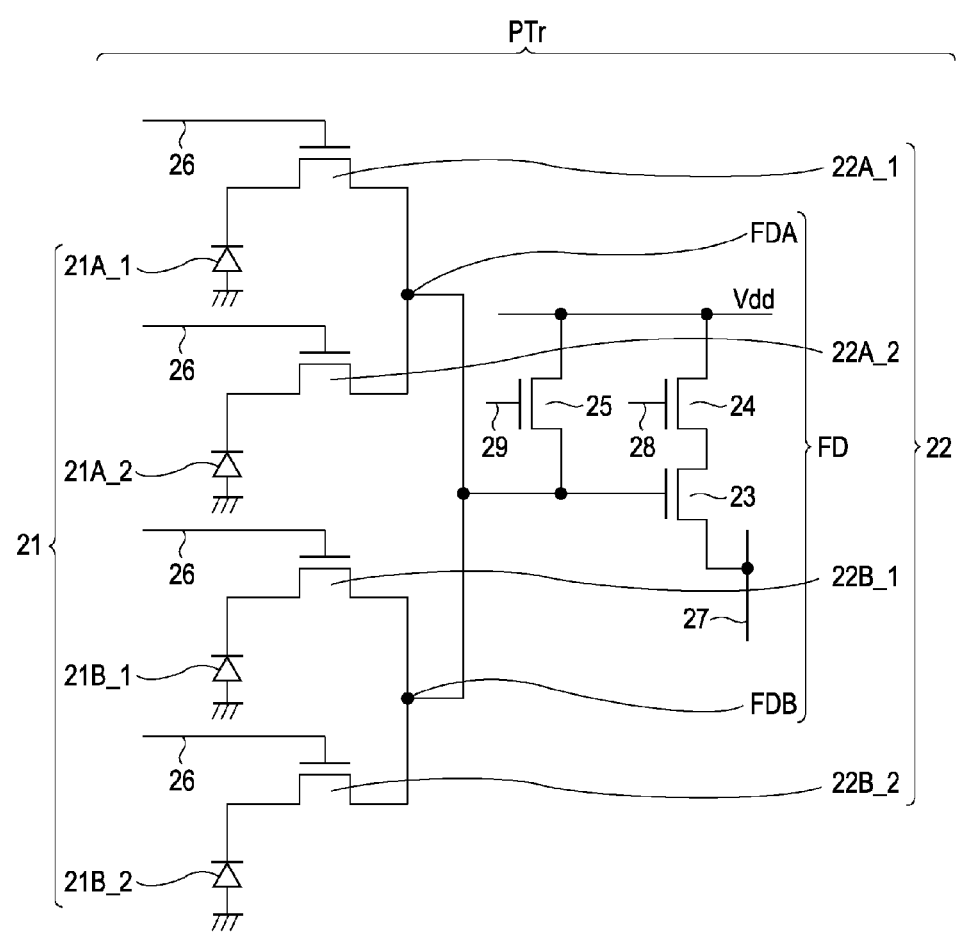
FIG. 17 is a diagram illustrating the principal portions of the solid-state imaging device according to the forth embodiment of the present invention.

Description will be made regarding the detailed content of the solid-state imaging device according to the present embodiment. FIGS. 16 and 17 are diagrams illustrating the principal portions of a solid-state imaging device according to the fourth embodiment of the present invention. Here, FIG. 16 illustrates the upper surface of the imaging region PA, and FIG. 17 illustrates the circuit configuration of the pixels P provided to the imaging region PA.

As illustrated in FIGS. 16 and 17, the solid-state imaging device 1 includes a photodiode 21, and a pixel transistor PTr. Here, the pixel transistor PTr includes, such as illustrated in FIG. 17, a transfer transistor 22, an amplification transistor 23, a selecting transistor 24, and a reset transistor 25, and is configured to read out signal charge from the photodiode 21. Each unit making up the solid-state imaging device will be described in order.

(1) About the Photodiode 21

With the solid-state imaging device 1, such as illustrated in FIG. 16, the multiple photodiodes 21 are disposed so as to correspond to the multiple pixels P, respectively. The multiple photodiodes 21 are disposed so as to be arrayed in each of the horizontal direction x, and the vertical direction y orthogonal to the horizontal direction x, of the imaging face (x-y face).

Each of the photodiodes 21 is configured to receive incident light (subject image) to generate signal charge by subjecting the incident light to photoelectric conversion, and to accumulate this. For example, each or the photodiodes 21 is configured by an n-type charge accumulation region being formed in a p-type semiconductor region provided within the substrate 101 that is an n-type silicon semiconductor. Subsequently, each of the photodiodes 21 is, such as illustrated in FIG. 17, configured so that the accumulated signal charge thereof is read out by the transfer transistor 22, and is transferred to the drain FD.

With the present embodiment, such as illustrated in FIGS. 16 and 17, a transfer transistor 22 is provided to each of the photodiodes 21 in pairs. For example, four transfer transistors 22 (22A_1, 22A_2, 22B_1, and 22B_2) are provided in pairs so as to correspond to four photodiodes 21 (21A_1, 21A_2, 21B_1, and 21B_2).

As illustrated in FIGS. 16 and 17, the multiple photodiodes 21 are configured so as to share the single readout drain FD. With the present embodiment, such as illustrated in FIG. 16, two photodiodes 21 (21A_1 and 21A_2, or 21B_1 and 21B_2) arrayed in the diagonal direction k are provided so as to share the single readout drain FD (FDA or FDB).

As illustrated in FIGS. 16 and 17, a set made up of the multiple photodiodes 21 is configured so as to share the amplification transistor 23, selecting transistor 24, and reset transistor 25 with multiple sets. For example, such as illustrated in FIG. 17, each of the amplification transistor 23, selecting transistor 24, and reset transistor 25 is provided to one set made up of four photodiodes 21 (21A_1, 21A_2, 21B_1, and 21B_2).

(2) About the Pixel Transistor PTr

With the solid-state imaging device 1, the pixel transistor PTr is provided between the multiple pixels P of the imaging face (x-y face), as shown in FIG. 16. With each of the pixel transistors PTr, an activated region (not illustrated) is formed in a region separating the multiple pixels P of the substrate 101, and each of the gate electrodes is formed, for example, with polysilicon.

With the pixel transistor PTr, the multiple transistors 22 are formed so as to correspond to each of the multiple pixels P such as illustrated in FIGS. 16 and 17.

Here, such as illustrated in FIG. 16, with the transfer transistors 22, a transfer gate is provided to the surface of the substrate 101 via a gate insulating film. With the transfer transistors 22, the transfer gate is provided adjacent to a readout drain FD (Floating Diffusion) provided to the surface of the substrate 101.

As illustrated in FIG. 17, the transfer transistors 22 are configured to output the signal charge generated at the photodiode 21 to the gate of the amplification transistor 23 as an electric signal. Specifically, in the event that a transfer signal has been given to the gate from a transfer line 26, the transfer transistor 22 transfers the signal charge accumulated at the photodiode 21 to the readout drain FD as an output signal.

With the present embodiment, such as illustrated in FIG. 16, the transfer transistors 22 are provided corresponding to the photodiodes 21, respectively. For example, such as illustrated in FIG. 16, each of the transfer transistors 22 is formed so that two transfer transistors 22 sandwich the readout drain FD provided between the multiple pixels P arrayed in the diagonal direction k inclined as to the horizontal direction x and the vertical direction y of the imaging face (x-y face).

Specifically, such as illustrated in FIG. 16, two transfer transistors 22A_1 and 22A_2 are provided so as to sandwich a readout drain FDA provided between two photodiodes 21A_1 and 21A_2 arrayed in the inclined direction. Also, two transfer transistors 22B_1 and 22B_2 are provided so as to sandwich a readout drain FDB provided between two photodiodes 21B_1 and 21B_2 arrayed in the inclined direction.

With the pixel transistor PTr, the amplification transistor 23 is, such as illustrated in FIG. 17, configured to amplify and output the electric signal output from the transfer transistor 22.

Specifically, with the amplification transistor 23, the gate is connected to the readout drain FD. Also, with the amplification transistor 23, the drain is connected to a power-supply potential supply line Vdd, and the source is connected to the selecting transistor 24. In the event that the selecting transistor 24 has been selected so as to be an on state, constant current is supplied from a constant current source (not illustrated), the amplification transistor 23 serves as a source follower. Therefore, with the amplification transistor 23, the output signal output from the readout drain FD is amplified by a selecting signal being supplied to the to the selecting transistor 24.

With the pixel transistor PTr, such as illustrated in FIG. 17, in the event that the selecting signal has been input, the selecting transistor 24 is configured to output the electric signal output by the amplification transistor 23 to a vertical signal line 27.

Specifically, with the selecting transistor 24, such as illustrated in FIG. 17, the gate is connected to an address line 28 to which the selecting signal is supplied. In the event that the selecting signal has been supplied, the selecting transistor 24 goes on, and outputs the output signal amplified as described above by the amplification transistor 23 to the vertical signal line 27.

With the pixel transistor PTr, the reset transistor 25 is, such as illustrated in FIG. 17, configured to reset the gate potential of the amplification transistor 23.

Specifically, with the reset transistor 25, such as illustrated in FIG. 17, the gate is connected to a reset line 29 to which the reset signal is supplied. Also, with the reset transistor 25, the drain is connected to the power-supply potential supply line Vdd, and the source is connected to the readout drain FD. In the event that the reset signal has been supplied to the gate from the reset line 29, the reset transistor 25 resets the gate potential of the amplification transistor 23 to power-supply potential via the readout drain FD.

With the present embodiment, each of the above amplification transistors 23, selecting transistor 24, and reset transistor 25 is, such as illustrated in FIG. 16, configured to be shared by a set made up of the multiple photodiodes 21.

For example, such as illustrated in FIG. 16, each of the amplification transistor 23, selecting transistor 24, and reset transistor 25 is provided to one set made up of four photodiodes 21 (21A_1, 21A_2, 21B_1, and 21B_2).

For example, each of the amplification transistor 23, selecting transistor 24, and reset transistor 25 is provided to the transistor region TR illustrated in FIG. 16.

(3) Others

While omitted from FIG. 16, a wiring layer (not illustrated) is provided to the surface of the substrate 101. With this wiring layer, wiring (not illustrated) electrically connected to each element is formed within an insulating layer (not illustrated). Each wiring is layered and formed so as to serve as a wiring such as the transfer line 26, address line 28, vertical signal line 27, reset line 29, or the like, shown in FIG. 17.

In addition, with the substrate 101, optical members such as a color filter, micro lenses, and so forth are provided so as to correspond to the pixels P. Though drawing is omitted, with the color filter, the filter layer of each color is disposed in the same way as with the first embodiment, for example, by a Bayer array.

Figure 18:
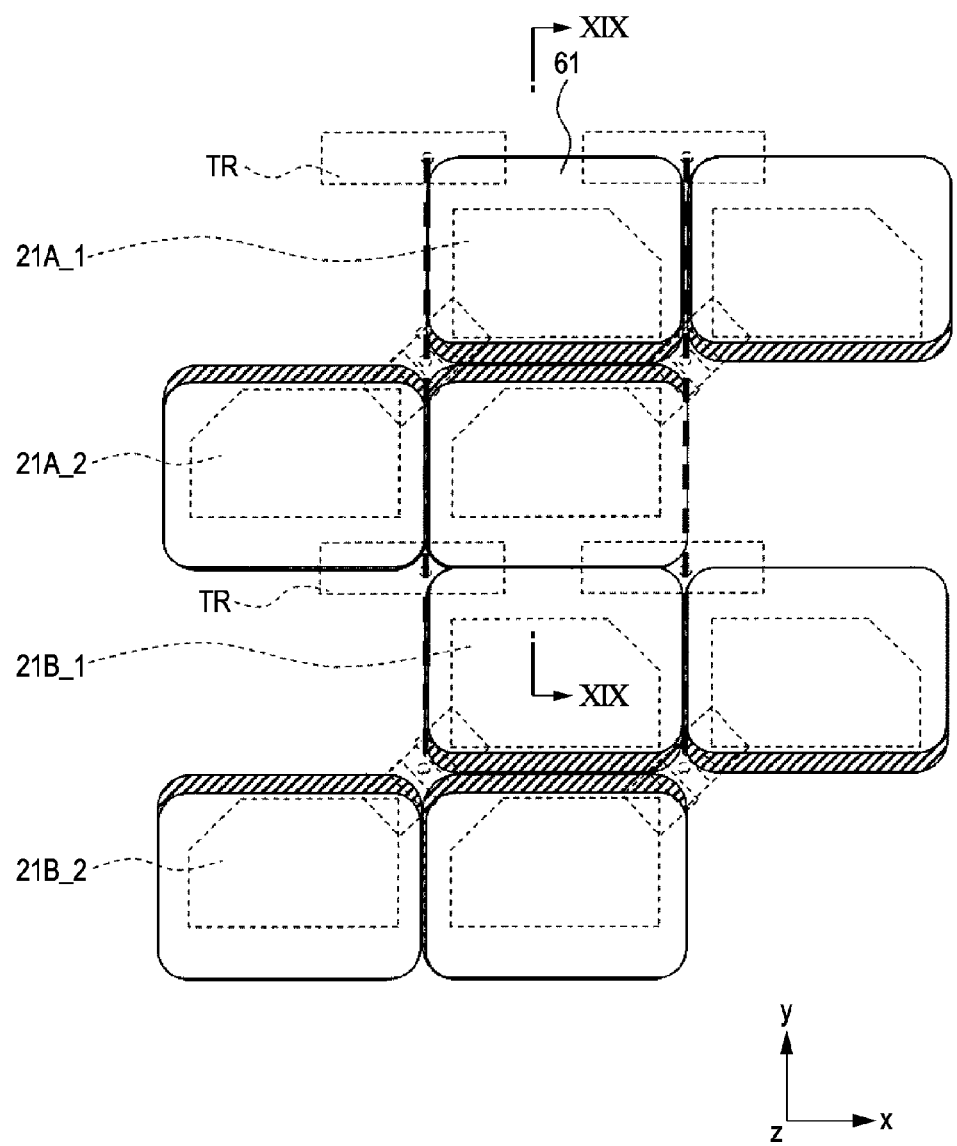
FIG. 18 is a diagram illustrating a micro lens according to the fourth embodiment of the present invention.
Figure 19:
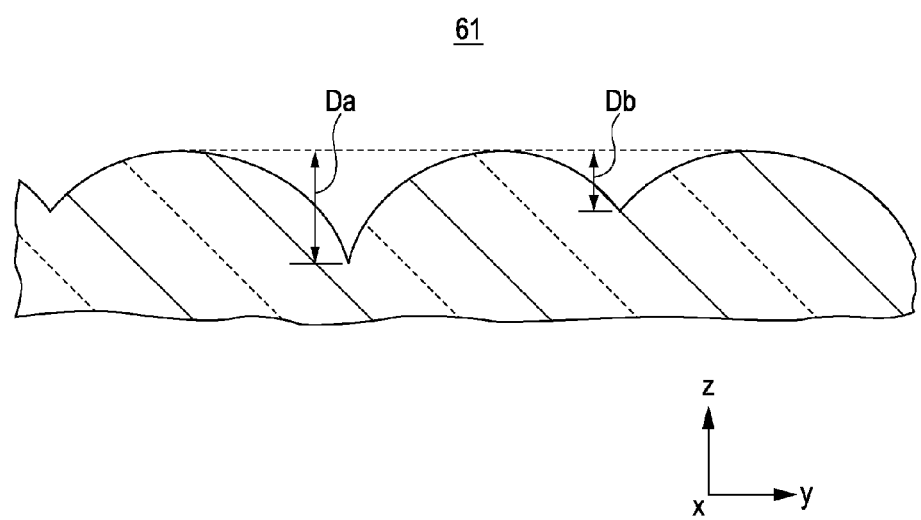
FIG. 19 is a diagram illustrating the micro lens according to the fourth embodiment of the present invention.

FIGS. 18 and 19 are, with the fourth embodiment of the present invention, diagrams illustrating the micro lens 61. Here, FIG. 18 illustrates, in the same way as FIG. 16, the upper surface, and FIG. 19 illustrates the cross-section of the XIX-XIX portion in FIG. 18. Note that in FIG. 18, with the lens surface of the micro lens, a portion where the curvature is high is indicated by hatching.

As illustrated in FIGS. 18 and 19, the micro lenses 61 are, similar to the first embodiment, convex lenses with the center being formed thicker than the edge, and are configured to focus incident light onto the light-receiving surface of the photodiode.

Here, such as illustrated in FIG. 18, each of the micro lenses 61 is, similar to the first embodiment, formed so that the planar shape is a square shape. Also, such as illustrated in FIGS. 18 and 19, each of the micro lenses 61 is formed so that the portion of the side corresponding to the transistor region TR is smaller in curvature than other portions. With the portion of the side corresponding to the transistor region TR, each of the micro lenses 61 is formed so that depth Da of a groove to be formed between the micro lenses 61 is shallower than depth Db of the groove of another portion.

Note that each of the micro lenses 61 can be formed, in the same way as with the first embodiment, by subjecting the lens material layer to the etchback process after converting the resist pattern into a lens shape such as described above.

C. Conclusion

As described above, with the multiple micro lenses 61, the depth Db of a groove between the micro lenses corresponding to a portion where the multiple photodiodes 21 are arrayed on the imaging face (x-y face) without the pixel transistor PTr being introduced therebetween is deeper than the depth Da of a groove between the micro lenses 61 of another portion. Also, the multiple micro lenses 61 are formed so that the curvature of the lens surface on the side of a portion where the multiple photodiodes 21 are arrayed on the imaging face (x-y face) without the pixel transistor PTr being introduced therebetween is higher than the curvature of the lens surface of another portion (see FIGS. 18 and 19).

Thus, with the present embodiment, the curvature of the lens surface of the micro lens 61 is small on the transistor region TR where the pixel transistor PTr is provided, and accordingly, occurrence of sensitivity unevenness can be prevented, and also influence of reflection from the gate electrode can be suppressed. Also, between the photo diodes 21 of other than on the transistor region TR, the curvature of the lens surface of the micro lens 61 is great, and accordingly, occurrence of color mixture can be prevented, and also sensitivity can be improved.

That is to say, regardless of the layout of a wiring layer, between the photodiodes 21 the accumulation charge of the photodiode 21 is readily leaked to another pixel at a portion where the pixel transistor PTr is provided as compared to a portion where no pixel transistor PTr is provided, but according to the above configuration, occurrence of this convenience can be prevented. Accordingly, the present embodiment can readily improve the image quality of an imaged image.

5. Others

Implementation of the present invention is not restricted to the above embodiments, and various modifications may be employed.

FIGS. 20 through 24 are diagrams illustrating the principal portions of a solid-state imaging device according to an embodiment of the present invention. Here, in each drawing, (A) illustrates, in the same way as FIG. 14, the upper surface of the solid-state imaging device excluding the micro lenses and the like, and (B) illustrates upper surface of the solid-state imaging device including the micro lenses. Note that (B) illustrates, in the same way as FIG. 16, a portion where the curvature of the lens surface of the micro lens is high, indicated by hatching.

Figure 20:
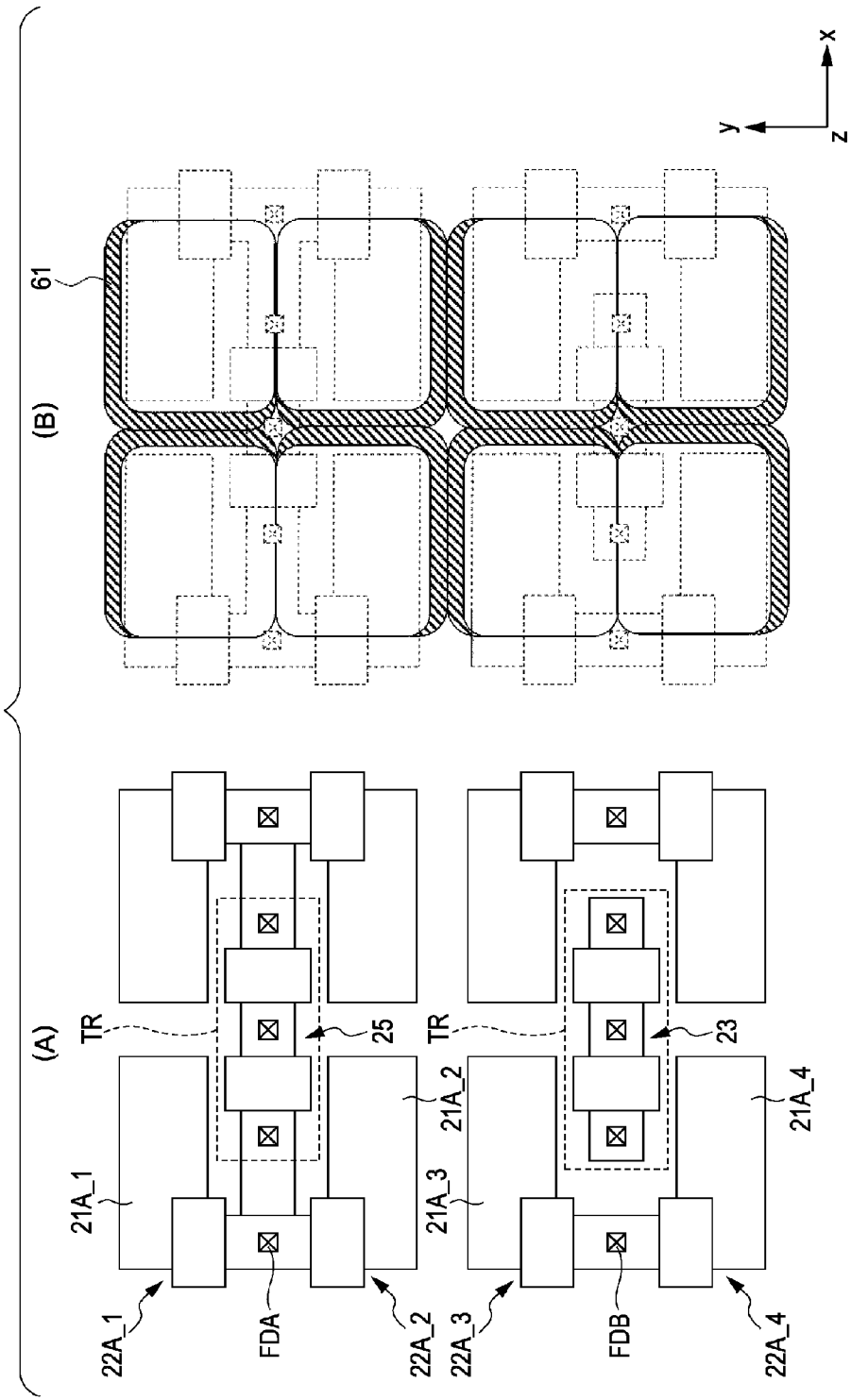
FIG. 20 is a diagram illustrating the principal portions of a solid state imaging device according to an embodiment of the present invention.

FIG. 20 illustrates a case where a pixel transistor to be shared is provided to the transistor region TR as to four pixels P arrayed in the vertical direction y (longitudinal direction).

Figure 21:
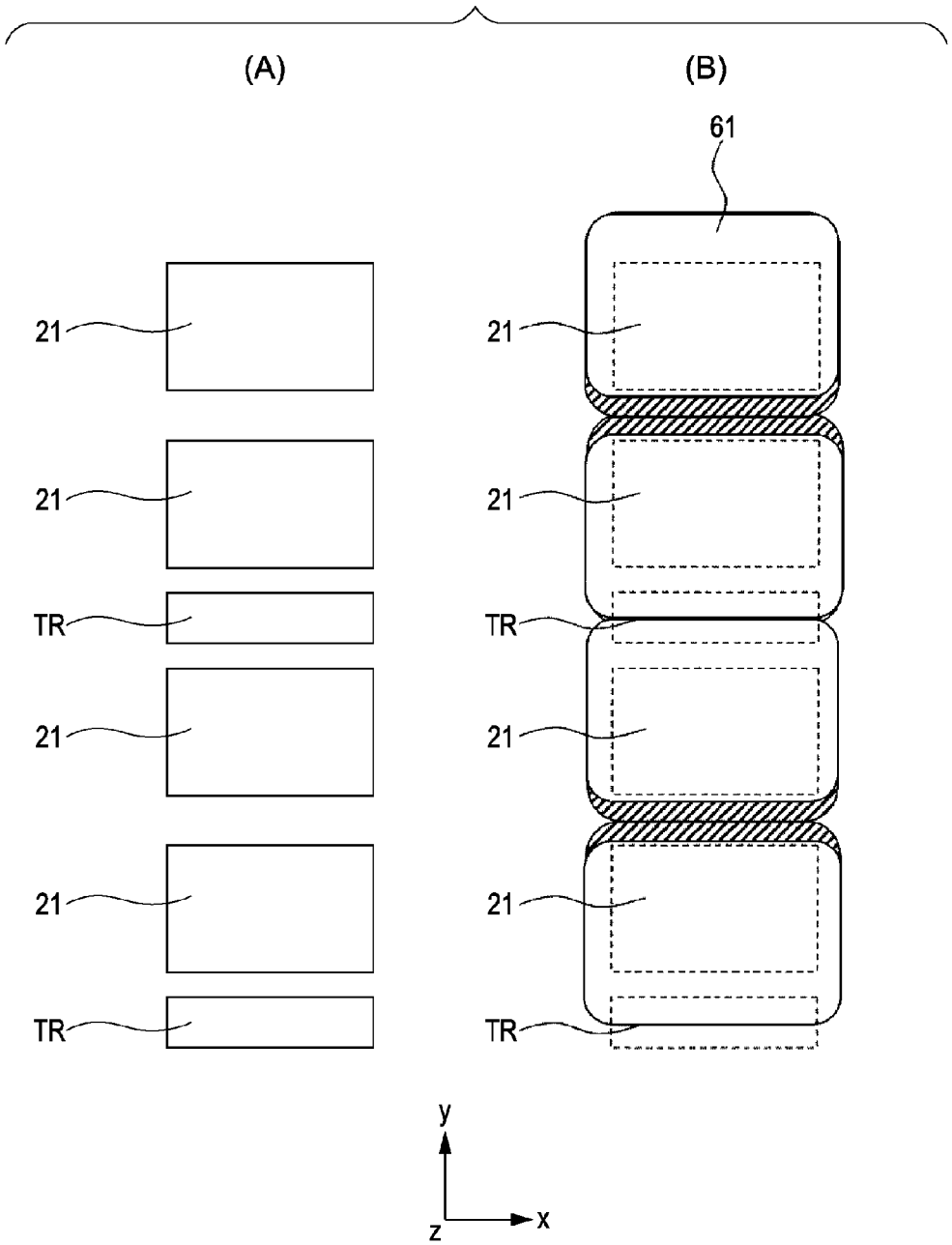
FIG. 21 is a diagram illustrating the principal portions of a solid state imaging device according to an embodiment of the present invention.
Figure 22:
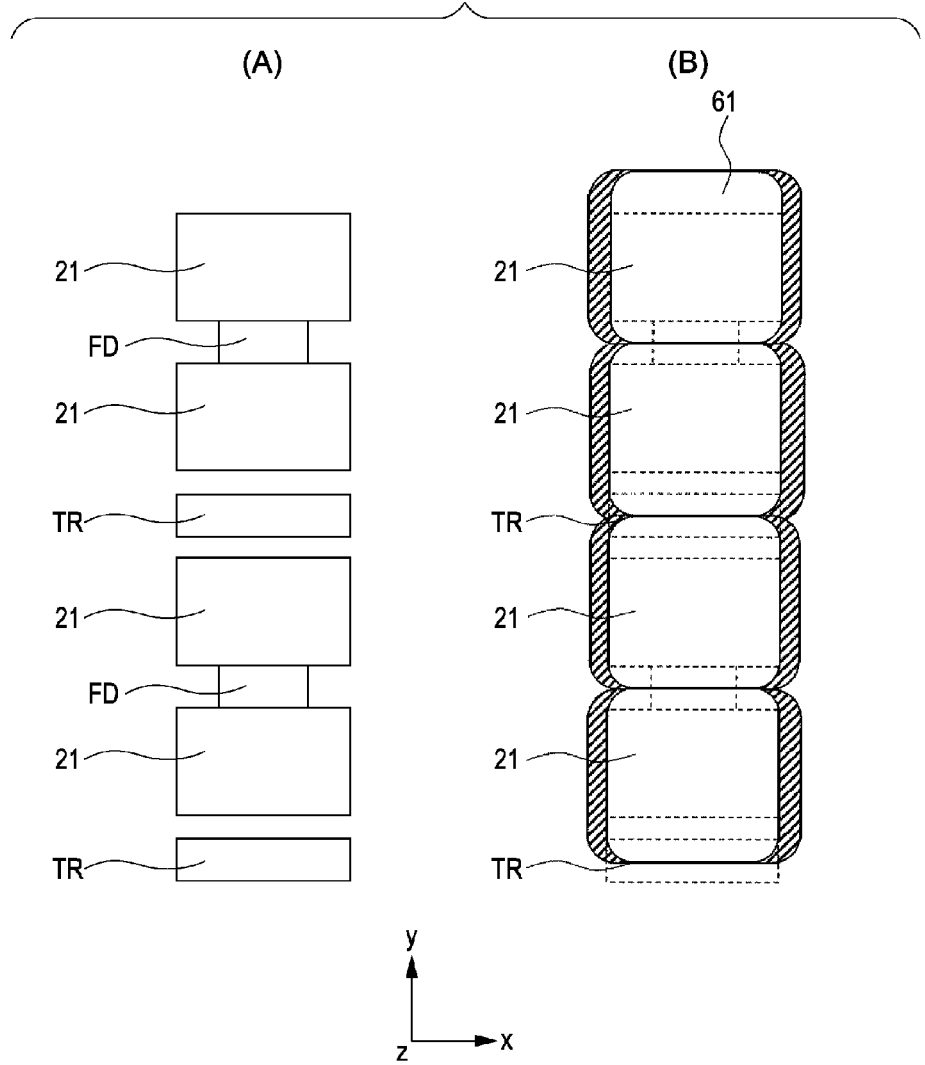
FIG. 22 is a diagram illustrating the principal portions of a solid state imaging device according to an embodiment of the present invention.
Figure 23:
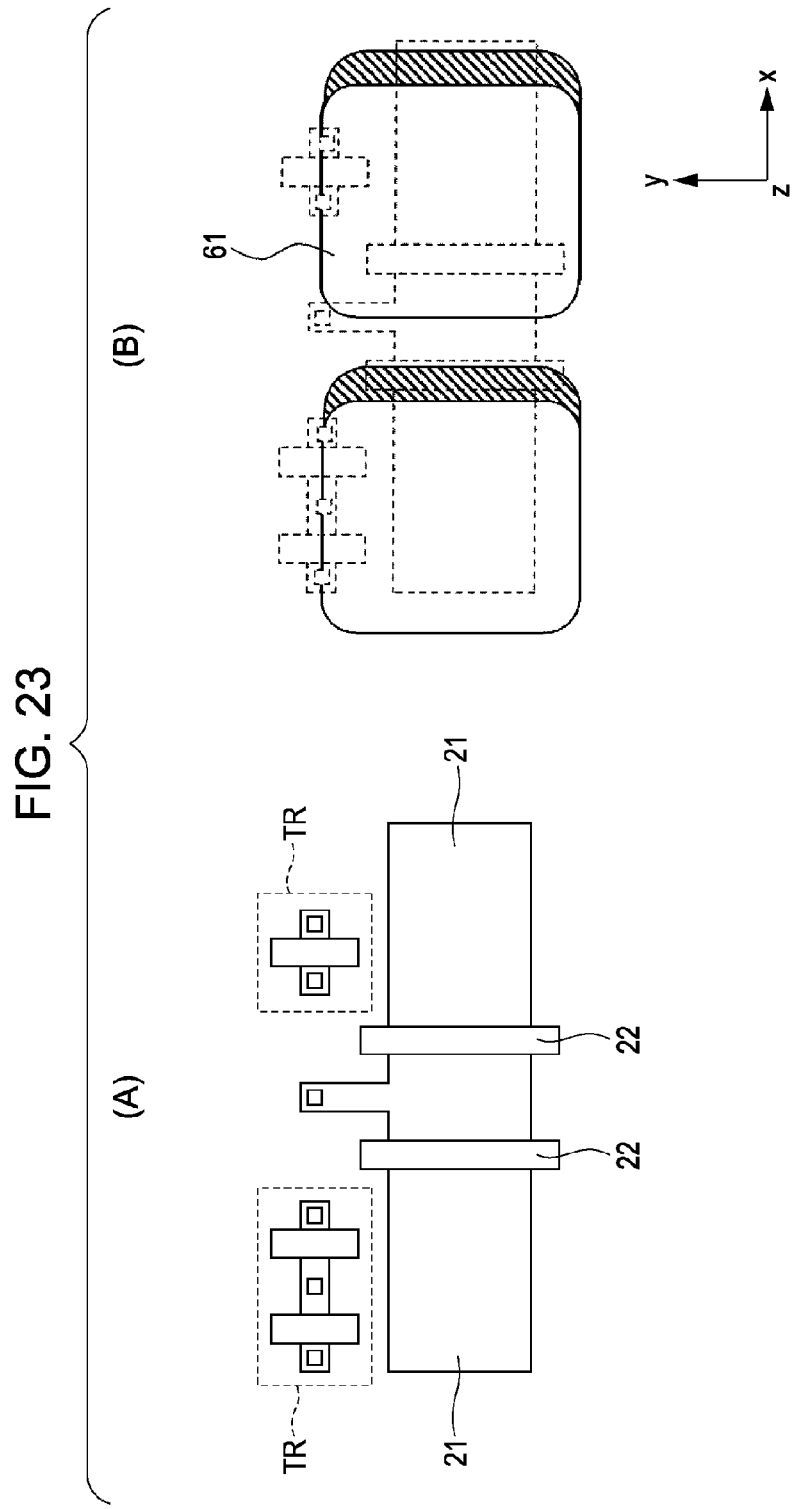
FIG. 23 is a diagram illustrating the principal portions of a solid state imaging device according to an embodiment of the present invention.
Figure 24:
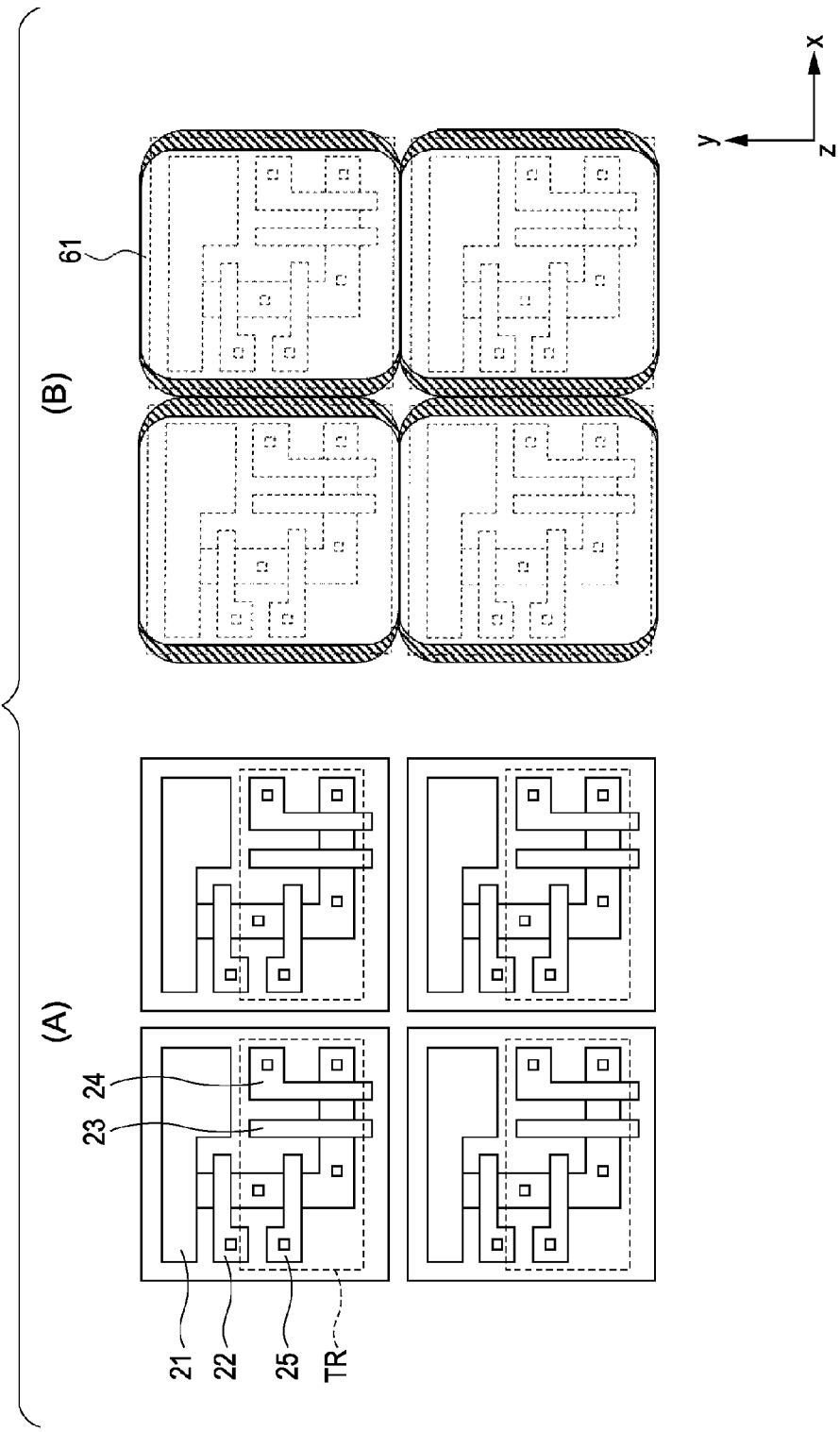
FIG. 24 is a diagram illustrating the principal portions of a solid state imaging device according to an embodiment of the present invention.

FIGS. 21 and 22 illustrate a case where a pixel transistor to be shared is provided to the transistor region TR as to two pixels P arrayed in the vertical direction y (longitudinal direction). Note that these configurations are described in Japanese Unexamined Patent Application Publication No. 2007-81015. FIG. 23 illustrates a case where a pixel transistor to be shared is provided to the transistor region TR as to two pixels P arrayed in the horizontal direction x (lateral direction). FIG. 24 illustrates a case where a pixel transistor is provided to the transistor region TR as to each pixel P.

With each of the above drawings, in the same way as with the fourth embodiment, the curvature of the lens surface of the micro lens 61 is small on the transistor region TR, and accordingly, occurrence of sensitivity unevenness can be prevented, and also influence of reflection from the gate electrode can be suppressed. Also, the curvature of the lens surface of the micro lens 61 is great between the photodiodes 21 other than on the transistor region TR, and accordingly, occurrence of color mixture can be prevented, and also sensitivity can be improved.

Also, with the above embodiments, description has been made regarding a front illumination type, but the present invention is not restricted to this. Even in the case of a backside illumination type, the present invention may be applied. With a backside illumination type, in particular, there is inconvenience such as occurrence of color mixture between adjacent pixels, or the like, but occurrence of color mixture can effectively be prevented by applying the present invention thereto.

Note that, with the above embodiments, the solid-state imaging device 1 corresponds to the solid-state imaging device described in the Summary of the Invention. Also, with the above embodiments, the photodiodes 21 correspond to the photoelectric conversion units described in the Summary of the Invention. Also, with the above embodiments, the charge transfer channel region 23T corresponds to the transfer channel region described in the Summary of the Invention. Also, with the above embodiments, the vertical transfer resistor unit VT corresponds to the transfer unit described in the Summary of the Invention. Also, with the above embodiments, the micro lens 61 corresponds to the micro lens described in the Summary of the Invention. Also, with the above embodiments, the substrate 101 corresponds to the substrate described in the Summary of the Invention. Also, with the above embodiments, the lens material layer 111z is the lens material layer described in the Summary of the Invention. Also, with the above embodiments, the camera 200 corresponds to the electronic device described in the Summary of the Invention. Also, with the above embodiments, the light-receiving surface JS corresponds to the light-receiving surface described in the Summary of the Invention. Also, with the above embodiments, the pixels P correspond to the pixels described in the Summary of the Invention. Also, with the above embodiments, the imaging face PS corresponds to the imaging face described in the Summary of the Invention. Also, with the above embodiments, the pixel transistor PTr corresponds to the pixel transistor described in the Summary of the Invention. Also, with the above embodiments, the resist pattern RP corresponds to the resist pattern described in the Summary of the Invention. Also, with the above embodiments, the diagonal direction k corresponds to the third direction described in the Summary of the Invention. Also, with the above embodiments, the horizontal direction x corresponds to the first direction described in the Summary of the Invention. Also, with the above embodiments, the vertical direction y corresponds to the second direction described in the Summary of the Invention.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
    a plurality of photoelectric conversion units disposed so as to be arrayed in each of a first direction and a second direction, wherein said second direction is orthogonal to said first direction;
    a plurality of micro lenses disposed above said plurality of photoelectric conversion units; and
    a pixel transistor configured to read out and output signal charge generated at said plurality of photoelectric conversion units;
    wherein said plurality of micro lenses are formed so that a depth of a groove between micro lenses corresponding to a portion where said plurality of photoelectric conversion units are arrayed with a floating diffusion region disposed therebetween and without said pixel transistor disposed therebetween is deeper than a depth of a groove between micro lenses of other portions.

2. The imaging device according to claim 1, wherein the other portions correspond to portions where said plurality of photoelectric conversion units are arrayed having said pixel transistor disposed therebetween.

3. The imaging device according to claim 1, wherein said plurality of micro lenses comprise a planar shape that includes a side extending in said first direction and a side extending in said second direction.

4. The imaging device according to claim 1, wherein the plurality of micro lenses are disposed so as to be arrayed mutually adjacent to each other in at least one of said first direction and said second direction.

5. The imaging device according to claim 1, wherein a curvature of the micro lens surface in a portion where said plurality of photoelectric conversion units are arrayed without said plurality of pixel transistors disposed therebetween is greater than the curvature of the micro lens surface of other portions.

6. The imaging device according to claim 1, wherein at least two photodiodes arrayed in a diagonal direction share a single floating diffusion region.

7. The imaging device according to claim 1, wherein the pixel transistor comprises a transfer transistor, an amplification transistor, a selection transistor, and a reset transistor, and wherein the plurality of photoelectric conversion units share the amplification transistor, the selection transistor, and the reset transistor.

* * * * *